(12) United States Patent
Kayaba et al.

(10) Patent No.: US 10,580,639 B2
(45) Date of Patent: Mar. 3, 2020

(54) SEALING COMPOSITION AND METHOD OF MANUFACTURING SEMICONDUCTOR DEVICE

(71) Applicant: MITSUI CHEMICALS, INC., Minato-ku, Tokyo (JP)

(72) Inventors: Yasuhisa Kayaba, Sodegaura (JP); Hirofumi Tanaka, Tsukuba (JP); Shoko Ono, Ichihara (JP); Koji Inoue, Ichihara (JP); Hiroko Wachi, Chiba (JP); Tsuneji Suzuki, Chiba (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 0 days.

(21) Appl. No.: 15/325,511

(22) PCT Filed: Aug. 5, 2015

(86) PCT No.: PCT/JP2015/072250
§ 371 (c)(1),
(2) Date: Jan. 11, 2017

(87) PCT Pub. No.: WO2016/021648
PCT Pub. Date: Feb. 11, 2016

(65) Prior Publication Data
US 2017/0162382 A1 Jun. 8, 2017

(30) Foreign Application Priority Data

Aug. 8, 2014 (JP) ................................ 2014-162433

(51) Int. Cl.
*H01L 21/02* (2006.01)
*H01L 23/532* (2006.01)
(Continued)

(52) U.S. Cl.
CPC ........ *H01L 21/02082* (2013.01); *C08L 79/00* (2013.01); *C09D 157/06* (2013.01);
(Continued)

(58) Field of Classification Search
CPC ............... H01L 21/02118; H01L 21/56; H01L 31/0481; H01L 33/56
See application file for complete search history.

(56) References Cited

U.S. PATENT DOCUMENTS 6,811,680 B2 11/2004 Chen et al.
2002/0038664 A1* 4/2002 Zenko ............... B32B 17/10743
136/251
(Continued)

FOREIGN PATENT DOCUMENTS

CN 101203944 A 6/2008
CN 103081076 A 5/2013
(Continued)

OTHER PUBLICATIONS

International Search Report (PCT/ISA/210) dated Oct. 27, 2015, by the Japanese Patent Office as the International Searching Authority for International Application No. PCT/JP2015/072250.
(Continued)

*Primary Examiner* — Zandra V Smith
*Assistant Examiner* — John M Parker
(74) *Attorney, Agent, or Firm* — Buchanan, Ingersoll & Rooney PC

(57) ABSTRACT

The invention provides a sealing composition including: polymer (A) containing a cationic functional group and having a weight average molecular weight of from 2,000 to 1,000,000; and a benzotriazole compound; in which the content of the polymer (A) is from 0.05 parts by mass to 0.20 parts by mass with respect to 100 parts by mass of the sealing composition; in which the content of the benzotri-
(Continued)

azole compound in the sealing composition is from 3 ppm by mass to 200 ppm by mass; and in which the sealing composition has a pH of from 3.0 to 6.5.

18 Claims, 6 Drawing Sheets

(51) Int. Cl.
*H01L 21/3105* (2006.01)
*C08L 79/00* (2006.01)
*C09D 157/06* (2006.01)

(52) U.S. Cl.
CPC .... *H01L 21/02104* (2013.01); *H01L 21/3105* (2013.01); *H01L 23/532* (2013.01); *H01L 21/02118* (2013.01); *H01L 2924/0002* (2013.01)

(56) References Cited

U.S. PATENT DOCUMENTS

| | | |
|---|---|---|
| 2002/0130049 A1 | 9/2002 | Chen et al. |
| 2004/0033700 A1 | 2/2004 | Gronbeck et al. |
| 2005/0056537 A1 | 3/2005 | Chen et al. |
| 2005/0264869 A1* | 12/2005 | Chen ................. G02F 1/167 359/296 |
| 2006/0216952 A1 | 9/2006 | Bhanap et al. |
| 2008/0139734 A1* | 6/2008 | Nakashima ............ C03C 27/10 524/505 |
| 2013/0171826 A1 | 7/2013 | Ono et al. |
| 2014/0367868 A1 | 12/2014 | Ono et al. |
| 2015/0187670 A1 | 7/2015 | Ono et al. |

FOREIGN PATENT DOCUMENTS

| | | |
|---|---|---|
| EP | 1369908 A2 | 12/2003 |
| EP | 2615635 A1 | 7/2013 |
| EP | 2806454 A1 | 11/2014 |
| EP | 2876675 A1 | 5/2015 |
| EP | 2978011 A1 | 1/2016 |
| JP | 2004-165613 A | 6/2004 |
| JP | 2008-537326 A | 9/2008 |
| KR | 10-2003-0082566 A | 10/2003 |
| WO | WO 2010/137711 A1 | 12/2010 |
| WO | WO 2012/033172 A1 | 3/2012 |
| WO | WO 2013/108791 A1 | 7/2013 |
| WO | WO 2014/013956 A1 | 1/2014 |

OTHER PUBLICATIONS

Written Opinion (PCT/ISA/237) dated Oct. 27, 2015, by the Japanese Patent Office as the International Searching Authority for International Application No. PCT/JP2015/072250.

Extended Search Report issued by the European Patent Office in corresponding European Patent Application No. 15830221.6-1211 dated Feb. 2, 2018 (10 pages).

First Notice of Opinion of Examination issued by the State Intellectual Property Office of People's Republic of China in corresponding Chinese Patent Application No. 201580038048.4 dated Sep. 6, 2018 (10 pages including partial English translation).

Notice for Submission of Opinions issued by the Korean Intellectual Property Office in corresponding Korean Patent Application No. 2017-7001512 dated May 28, 2018 (12 pages including partial English translation).

Second Notice of Opinion of Examination issued by the State Intellectual Property Office of People's Republic of China in corresponding Chinese Patent Application No. 2015800380484 dated Apr. 12, 2019 (14 pages including partial English translation).

* cited by examiner

SEALING COMPOSITION AND METHOD OF MANUFACTURING SEMICONDUCTOR DEVICE

TECHNICAL FIELD

The present invention relates to a sealing composition, and a method of manufacturing a semiconductor device.

BACKGROUND ART

Conventionally, in various technical fields such as the field of electronic devices, application of a composition containing a polymer to a member has been conducted.

For example, a technique is known in which a semiconductor composition that includes a polymer containing two or more cationic functional groups and having a weight average molecular weight of from 2,000 to 100,000 is applied to an interlayer insulating layer of a semiconductor device (see Patent Document 1, for example).

Further, a technique is known, for example, in which a semiconductor sealing composition including a resin containing a cationic functional group and having a weight average molecular weight of from 2,000 to 600,000 is applied to at least a part of a surface of a semiconductor substrate to form a semiconductor sealing layer, and the face of the semiconductor substrate on which the semiconductor sealing layer has been formed is cleaned with a rinsing liquid having a pH at 25° C. of 6 or less (See Patent Document 2, for example).

Still further, a technique is disclosed for example, in which a semiconductor sealing composition including a polymer containing a cationic functional group and having a weight average molecular weight of from 2,000 to 1,000,000 is applied at least to a bottom face and a side face of a concave portion of a semiconductor substrate to form a semiconductor sealing layer at least on the bottom face and the side face of the concave portion of the semiconductor substrate, and then the face of the semiconductor substrate on the side on which the semiconductor sealing layer has been formed is subjected to a heat treatment under conditions of a temperature of from 200° C. to 425° C., followed by removing at least a part of the semiconductor sealing layer formed on of an exposed face of wiring (see Patent Document 3, for example).

RELATED ART DOCUMENTS

Patent Documents

Patent Document 1: WO 2010/137711
Patent Document 2: WO 2012/033172
Patent Document 3: WO 2014/013956

SUMMARY OF INVENTION

Technical Problem

A semiconductor device which includes a semiconductor substrate including on a surface thereof an interlayer insulating layer provided with a concave portion, and wiring, is increasingly miniaturized. As a sealing composition, any sealing composition which is capable of sealing pores present in the interlayer insulating layer and which does not remain on the wiring made of a material such as copper can be used. However, in the case of using a conventional sealing composition, there is a potential risk that the dissolution of wiring material such as copper cannot be inhibited, thereby resulting in a decrease in the amount of the wiring material. As a result, there is a potential risk of failing to maintain an electrical conductivity of the wiring. In a miniaturized semiconductor device, in particular, a decrease in the amount of wiring material leads to a major problem.

One embodiment of the invention has been made in view of the above problems, and an object thereof is to provide a method of manufacturing a semiconductor device in which polymer (A) contained in a sealing composition can be made less likely to remain on the bottom face of a concave portion of an interlayer insulating layer and on wiring, while maintaining a sealing property provided by the sealing composition at the side face of the concave portion, and in which a decrease in the amount of wiring material such as copper can be reduced to maintain the electrical conductivity of the wiring material, and to provide the sealing composition used in the manufacture of such a semiconductor device.

An object of another embodiment of the invention is to provide a method of manufacturing a semiconductor device in which polymer (A) contained in a sealing composition can be made less likely to remain on wiring while maintaining the sealing property provided by the sealing composition at a surface of an interlayer insulating layer, and in which a decrease in the amount of wiring material such as copper can be reduced to maintain the electrical conductivity of the wiring material, and to provide the sealing composition used in the manufacture of such a semiconductor device.

Solution to Problem

Specific means for solving the above mentioned problems are as follows.

<1> A sealing composition, comprising:
polymer (A) containing a cationic functional group and having a weight average molecular weight of from 2,000 to 1,000,000; and
a benzotriazole compound;
wherein a content of the polymer (A) is from 0.05 parts by mass to 0.20 parts by mass with respect to 100 parts by mass of the sealing composition;
wherein a content of the benzotriazole compound in the sealing composition is from 3 ppm by mass to 200 ppm by mass; and
wherein the sealing composition has a pH of from 3.0 to 6.5.

<2> A sealing composition, comprising:
polymer (A) containing a cationic functional group and having a weight average molecular weight of from 2,000 to 1,000,000; and
a benzotriazole compound;
wherein a content of the benzotriazole compound in the sealing composition is from 3 ppm by mass to 200 ppm by mass; and
wherein the sealing composition has a pH of from 3.0 to 6.5.

<3> The sealing composition according to <1> or <2>, further comprising a monocarboxylic acid compound.

<4> The sealing composition according to any one of <1> to <3>, wherein a content of sodium and a content of potassium in the sealing composition are each 10 ppb by mass or less, on an elemental basis.

<5> A method of manufacturing a semiconductor device, the semiconductor device comprising a semiconductor substrate including an interlayer insulating layer provided with a concave portion, and wiring containing copper, wherein at least a part of a surface of the wiring is exposed to at least a part of a bottom face of the concave portion; and
the method comprising:
a sealing composition application process in which the sealing composition according to <1> is applied at least to the bottom face and a side face of the concave portion of the semiconductor substrate; and
a cleaning process in which at least the side face and the bottom face of the concave portion are cleaned with a rinsing liquid containing a polyvalent carboxylic acid monomer in an amount of from 0.3 millimole/liter to 230 millimole/liter, and which is carried out after the sealing composition application process.

<6> A method of manufacturing a semiconductor device, the semiconductor device comprising a semiconductor substrate including an interlayer insulating layer, and wiring containing copper; and
the method comprising:
a sealing composition application process in which the sealing composition according to <2> is applied at least to surfaces of the interlayer insulating layer and the wiring of the semiconductor substrate; and
a cleaning process in which at least the surfaces of the interlayer insulating layer and the wiring are cleaned with a rinsing liquid containing a polyvalent carboxylic acid monomer in an amount of from 0.3 millimole/liter to 230 millimole/liter, and which is carried out after the sealing composition application process.

<7> The method of manufacturing a semiconductor device according to <5> or <6>, wherein the polyvalent carboxylic acid monomer satisfies at least one of the following: having two aromatic rings; or having a molecular weight of 342 or more.

<8> The method of manufacturing a semiconductor device according to any one of <5> to <7>, wherein the rinsing liquid has a pH of from 4.0 to 7.0.

<9> The method of manufacturing a semiconductor device according to any one of <5> to <8>, wherein a content of sodium and a content of potassium in the sealing composition are each 10 ppb by mass or less on an elemental basis.

<10> The method of manufacturing a semiconductor device according to any one of <5> to <9>, the method comprising a heating process in which the semiconductor substrate is heated at a temperature of from 70° C. to 125° C., and which is carried out after the sealing composition application process and before the cleaning process.

<11> The method of manufacturing a semiconductor device according to any one of <5> to <10>, the method comprising a high temperature heating process in which the semiconductor substrate is heated at a temperature of from 200° C. to 425° C., and which is carried out after the cleaning process.

<12> The method of manufacturing a semiconductor device according to any one of <5> to <11>, wherein the sealing composition further comprises a monocarboxylic acid.

Advantageous Effects of Invention

According to one embodiment of the invention, it is possible to provide a method of manufacturing a semiconductor device in which polymer (A) contained in a sealing composition can be made less likely to remain on the bottom face of a concave portion of an interlayer insulating layer, and on wiring, while maintaining the sealing property provided by the sealing composition at the side face of the concave portion, and in which a decrease in the amount of wiring material such as copper can be reduced to maintain the electrical conductivity of the wiring material, and to provide the sealing composition used in the manufacture of such a semiconductor device.

According to another embodiment of the invention, it is possible to provide, as an object, a method of manufacturing a semiconductor device in which polymer (A) contained in a sealing composition can be made less likely to remain on wiring while maintaining the sealing property provided by the sealing composition at a surface of an interlayer insulating layer, and in which a decrease in the amount of wiring material such as copper can be reduced to maintain the electrical conductivity of the wiring material, and to provide the sealing composition used in the manufacture of such a semiconductor device.

DESCRIPTION OF EMBODIMENTS

Figure 1:
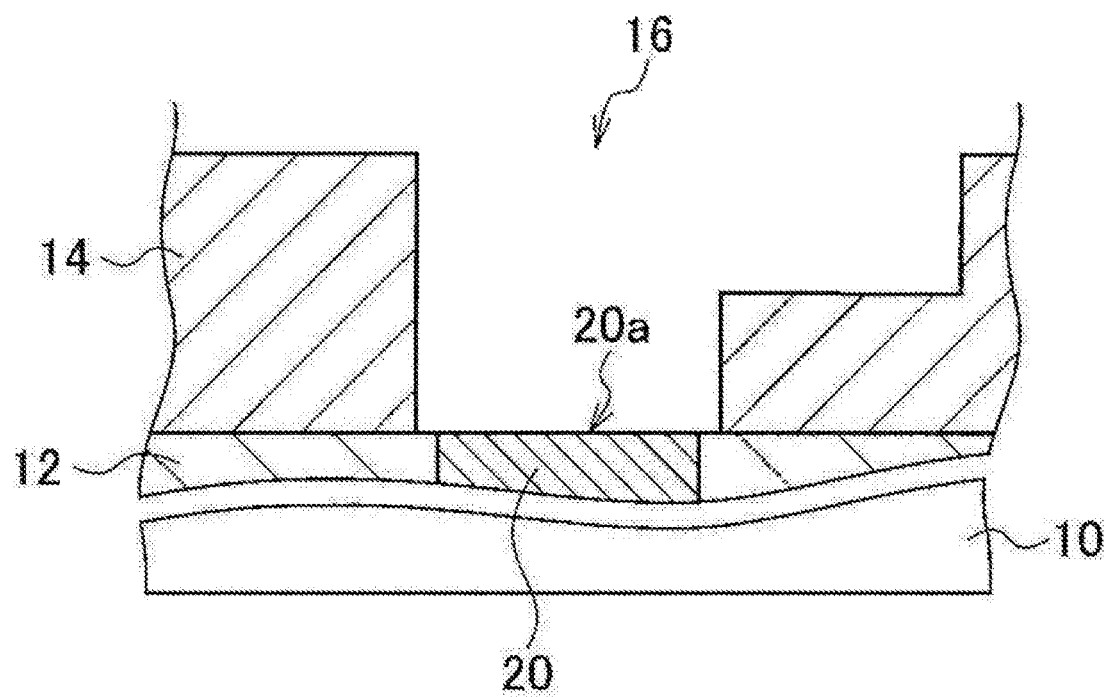
FIG. 1 is a conceptual sectional diagram schematically showing a cross section of a semiconductor substrate before being subjected to a sealing composition application process in the method of manufacturing a semiconductor device according to a first embodiment of the invention.

In the present specification, any numerical range indicated using an expression "from * to" represents a range in which numerical values described before and after the "* to" are included in the range as the lower limit value and the upper limit value thereof.

Specific embodiments (a first embodiment and a second embodiment) of the invention will now be described below in detail, with reference to FIG. 1 to FIG. 6. However, the invention is by no means limited by the following embodiments, and modifications can be made, if appropriate, within the scope of the objects of the invention. In the drawings (FIG. 1 to FIG. 6), structural elements (such as an etching stopper layer) which are not essential in the invention are not shown. Further, in the following description, the same member is shown with the same symbol, and repeated description may be omitted.

First Embodiment

<Method of Manufacturing Semiconductor Device>

In the method of manufacturing a semiconductor device according to the first embodiment of the invention, the semiconductor device includes a semiconductor substrate including an interlayer insulating layer provided with a concave portion, and wiring containing copper, wherein at least a part of a surface of the wiring is exposed to at least a part of a bottom face of the concave portion. The manufacturing method includes a sealing composition application process in which a sealing composition is applied at least to the bottom face and a side face of the concave portion of the semiconductor substrate, and a cleaning process in which at least the side face and the bottom face of the concave portion are cleaned with a rinsing liquid containing a polyvalent carboxylic acid monomer in an amount of from 0.3 millimole/liter to 230 millimole/liter, and which is carried out after the sealing composition application process. The sealing composition includes polymer (A) containing a cationic functional group and having a weight average molecular weight of from 2,000 to 1,000,000, and a benzotriazole compound. The content of the polymer (A) is from 0.05 parts by mass to 0.20 parts by mass with respect to 100 parts by mass of the sealing composition, and the content of the benzotriazole compound in the sealing composition is from 3 ppm by mass to 200 ppm by mass. In addition, the sealing composition has a pH of from 3.0 to 6.5.

According to the above described method of manufacturing a semiconductor device, it is possible to manufacture a semiconductor device in which a decrease in the amount of wiring material such as copper can be reduced, thereby maintaining the electrical conductivity of the wiring.

In other words, in the method of manufacturing a semiconductor device according to the first embodiment, the polymer (A) and the benzotriazole compound described above are combined, and the sealing composition in which each of the polymer (A) and the benzotriazole compound is adjusted to have a predetermined concentration is applied at least to the bottom face and the side face of the concave portion of the semiconductor substrate. In this process, it is possible to obtain an effect of making the polymer (A) contained in the sealing composition less likely to remain on the bottom face of the concave portion and on the wiring, while maintaining the sealing property provided by the sealing composition at the side face of the concave portion Further, the dissolution of a wiring material such as copper can be inhibited to reduce a decrease in the amount of the wiring material, and accordingly, the electrical conductivity of the wiring is maintained without being deteriorated. Thus, the method is particularly useful in the manufacture of a miniaturized semiconductor device.

More specifically, when the sealing composition has a pH of 3.0 or more, the polymer (A) in the sealing composition is more easily adsorbed to the interlayer insulating layer, thereby allowing for maintaining the sealing property of the composition at the side face of the concave portion. When the sealing composition has a pH of 6.5 or less, on the other hand, the polymer (A) is less likely to adhere to the wiring, thereby making the polymer (A) less likely to remain on the wiring containing copper. Further, when the content of the polymer (A) in the sealing composition is 0.05 parts by mass or more, the sealing property of the sealing composition can be suitably maintained. When the content of the polymer (A) in the sealing composition is 0.20 parts by mass or less, on the other hand, it is possible to reduce the amount of the sealing composition adhered to the bottom face of the concave portion and the surface of the wiring. As a result, the removability of the sealing composition (sealing layer) at the bottom face of the concave portion and the surface of the wiring is improved.

In addition, when the content of the benzotriazole compound in the sealing composition is 3 ppm by mass or more, the dissolution of a wiring material such as copper can be inhibited. When the content is 200 ppm by mass or less, on the other hand, a decrease in the sealing property of the sealing composition can be reduced.

FIG. 1 is the conceptual sectional diagram schematically showing the cross section of the semiconductor substrate before being subjected to a sealing composition application process. As shown in FIG. 1, on a semiconductor substrate 10, a first interlayer insulating layer 14, a second interlayer insulating layer 12 disposed on a lower layer side (the side closer to the semiconductor substrate 10) of the first interlayer insulating layer 14, and wiring 20 embedded in the second interlayer insulating layer 12, are provided. The wiring 20 contains at least copper.

In the first interlayer insulating layer 14, a concave portion 16 is formed in advance by etching such as dry etching, and the wiring 20 is exposed to at least a part of the bottom face of the concave portion 16. In other words, at least a part of the bottom face of the concave portion 16 is constituted by an exposed face 20a of the wiring 20.

However, the semiconductor substrate before being subjected to the sealing composition application process is not limited to this example.

For example, a barrier layer or the like may be formed on at least a part of the side face of the concave portion 16.

Further, another layer(s) such as an etching stopper layer may be present between the first interlayer insulating layer 14 and the second interlayer insulating layer 12. Alternatively, the first interlayer insulating layer 14 and the second interlayer insulating layer 12 may be integrated to constitute one interlayer insulating layer.

The concave portion 16 shown in FIG. 1 has a cross sectional shape having two types of depth (in the shape of stairs); however, the cross sectional shape of the concave portion in the first embodiment of the invention is not limited to this example. The concave portion 16 may have a cross sectional shape having only one type of depth (having a fixed depth), or a cross sectional shape having three or more types of depth. Further, in addition to the concave portion 16, the interlayer insulating layer may be provided with another concave portion(s) whose deepest portion has a depth different from the depth of the concave portion 16.

In addition, a semiconductor circuit or the like, such as a transistor, may be provided between the semiconductor substrate 10, and the wiring 20 and the second interlayer insulating layer 12, if necessary.

[Sealing Composition Application Process]

The sealing composition application process is a process in which the sealing composition is applied at least to the bottom face and the side face of the concave portion 16 of the semiconductor substrate 10. The semiconductor substrate 10 includes interlayer insulating layers (the first interlayer insulating layer 14 and the second interlayer insulating layer 12) provided with the concave portion 16, and the wiring 20 containing copper, wherein at least a part of the surface of the wiring 20 is exposed to at least a part of the bottom face of the concave portion 16.

Figure 2:
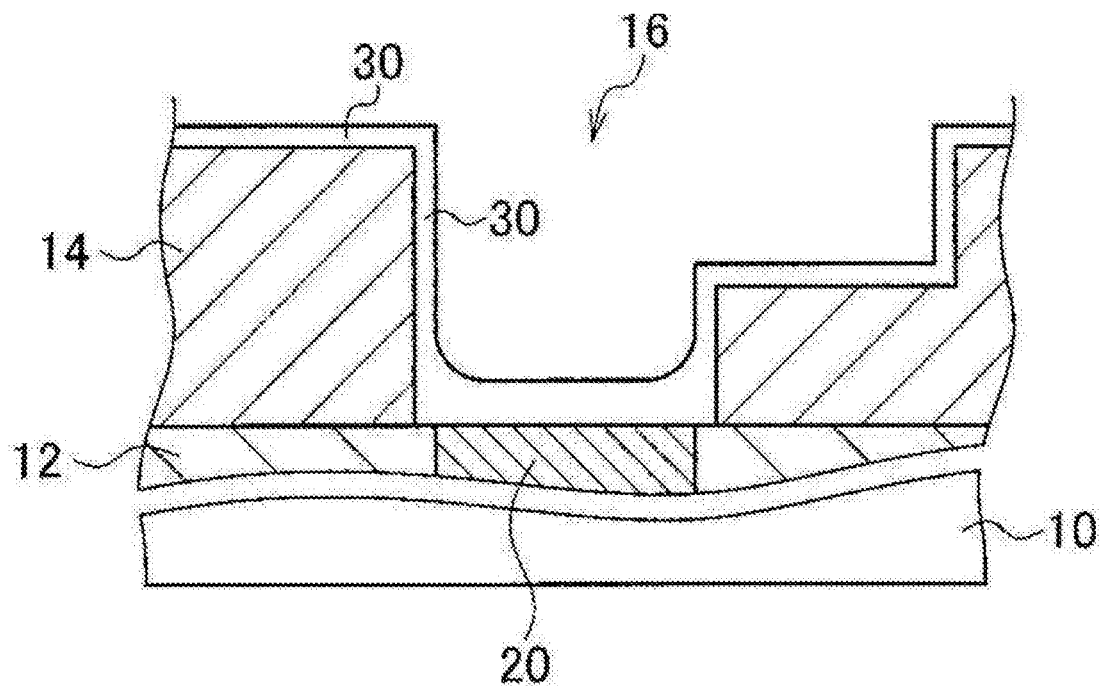
FIG. 2 is a conceptual sectional diagram schematically showing a cross section of the semiconductor substrate after being subjected to the sealing composition application process in the method of manufacturing a semiconductor device according to the first embodiment.

FIG. 2 is the conceptual sectional diagram schematically showing the cross section of the semiconductor substrate after being subjected to the sealing composition application process. As shown in FIG. 2, in the sealing composition application process, the sealing composition is applied to the semiconductor substrate 10 on the side on which the first interlayer insulating layer 14 and the like shown in FIG. 1 are provided, and a sealing layer 30 as a semiconductor sealing layer is formed at least on the bottom face and the side face of the concave portion 16. In this process, the sealing layer 30 is formed also on the exposed face 20a of the wiring 20.

The configuration of the semiconductor substrate, the interlayer insulating layers, the wirings, and the like will now be described below.

(Semiconductor Substrate)

The semiconductor substrate 10 is not particularly limited, and any commonly used semiconductor substrate can be used. Specifically, a silicon wafer or a silicon wafer on which a circuit such as a transistor is formed can be used as the semiconductor substrate 10.

The semiconductor substrate 10 includes thereon at least the interlayer insulating layer provided with the concave portion 16, and the wiring 20 containing copper, wherein at least a part of the surface of the wiring 20 is exposed to at least a part of the bottom face of the concave portion 16. The semiconductor substrate 10 may include thereon a concave portion in which wiring containing copper is not provided at its bottom face.

(Interlayer Insulating Layers)

As the interlayer insulating layers, for example, an insulating layer containing silica can be used. However, it is preferable that at least one of the interlayer insulating layers is a porous interlayer insulating layer.

In such an embodiment, since pores in the porous interlayer insulating layer can be covered by the sealing composition, it is possible to further reduce an increase in a dielectric constant and an occurrence of leakage current, which may be caused by a penetration of a metal component (such as copper) or a plasma component into the pores.

Further, it is preferable that the porous interlayer insulating layer contains a porous silica, and has a silanol residue derived from the porous silica on a surface thereof (preferably, the face to which the sealing composition is to be applied, such as the side face of the concave portion 16 or the like). The interaction between the silanol residue and the cationic functional group contained in the polymer (A) to be described later improves the pore-covering property of the polymer (A).

The pore radius of the pores in the porous interlayer insulating layer is not particularly limited. However, the pore radius is preferably from 0.5 nm to 3.0 nm, and more preferably from 1.0 nm to 2.5 nm, from the viewpoint of more effectively achieving the effect of the sealing property provided by the sealing layer 30.

As the porous silica, any porous silica commonly used for an interlayer insulating layer in a semiconductor device can be used without limitation. Examples thereof include an oxide having uniform meso-pores which is obtained by utilizing self-organization of an organic compound and an inorganic compound, and which is obtained via hydrothermal synthesis in a sealed heat-resistant container, using silica gel, a surfactant, and the like, as described in WO 91/11390; and a porous silica produced from a condensate of an alkoxysilane and a surfactant, as described in Nature, vol. 379 (page 703), 1996, and Supramolecular Science, vol. 5 (page 247 and the like), 1998.

As the porous silica, it is also preferable to use a porous silica (for example, a porous silica which is formed using a composition including a specific siloxane compound) described in WO 2009/123104 and WO 2010/137711.

The porous interlayer insulating layer can be formed, for example, by coating a composition for forming the porous silica described above on a semiconductor substrate, and then carrying out a heat treatment or the like, if appropriate.

The concave portion 16 provided in the interlayer insulating layer is a concave portion (cavity) formed in the interlayer insulating layer by etching or the like. The concave portion 16 is formed for the purpose of embedding, for example, a wiring material, in a subsequent process. Specific examples of the concave portion 16 include trenches and vias.

The concave portion 16 can be formed to have a width of, for example, from 10 nm to 32 nm.

The bottom face of the concave portion 16 refers to a face which is located at the deepest portion of the concave portion 16 (namely, the face located closest to the surface of the semiconductor substrate 10), of the wall faces of the concave portion 16, and which is approximately parallel to the surface of the semiconductor substrate 10. The side face of the concave portion 16 refers to any of the faces other than the bottom face, of the wall faces of the concave portion 16.

The application of the sealing composition to the bottom face and the side face of the concave portion 16 is useful, since it allows for effectively inhibiting the diffusion of a material included in the wiring into the pores of the porous interlayer insulating layer, in the subsequent process of embedding the wiring material into the concave portion 16.

The process of forming the concave portion 16 in the interlayer insulating layer can be carried according to process conditions commonly used in the manufacture of a semiconductor device. For example, the concave portion 16 having a desired pattern can be provided by forming a hard mask and a photoresist on the interlayer insulating layer, and then carrying out etching based on the pattern of the photoresist. In a case in which the porous interlayer insulating layer contains a porous silica, as described above, the surface of the porous silica is scraped off when the concave portion 16 is formed, and thus, the density of silanol groups at the surface tends to increase.

The semiconductor substrate 10 is provided with the wiring 20 containing copper, and at least a part of the surface of the wiring 20 is exposed to at least a part of the bottom face of the concave portion 16. In other words, at least a part of the bottom face of the concave portion 16 constitutes the exposed face 20a of the wiring 20 containing copper. The wiring 20 including the exposed face 20a and wiring (first wiring 40) to be embedded in the concave portion 16 in the subsequent process are electrically connected via the exposed face 20a.

(Wirings)

The wirings containing copper (such as the first wiring 40 and a second wiring 50 to be described later) preferably contain copper as a main component.

The "main component" as used herein refers to a component which is contained at the highest content percentage (atomic %).

The content percentage of the main component is preferably 50 atomic % or more, more preferably, 80 atomic % or more, and still more preferably 90 atomic % or more.

The wirings may contain another element (for example, a metal element such as Cu, Al, Ni, Fe, Sn, Cr, Pt, Zn, Mg, Ta, Ti, Mn, Co, W, or Ru, or a non-metal element such as N or O), if necessary.

The wiring containing copper (such as the second wiring 50 to be described later) in which at least a part of the surface of the wiring is exposed to at least a part of the bottom face of the concave portion 16, and the wiring (such as the first wiring 40 to be described later) to be embedded in the concave portion 16 in the subsequent process, can both be prepared according to known process conditions. For example, a copper wiring is formed directly on a silicon wafer, or on the interlayer insulating layer provided with the concave portion 16, by a metal CVD method, a sputtering method, or an electroplating method, and then a chemical mechanical polishing (CMP) is used to planarize a film thereby formed. Further, it is possible to form a multilayer structure, if necessary, by forming a cap film on the surface of the film, and then forming a hard mask, followed by repeating the processes of forming an interlayer insulating layer and forming wiring.

With regard to the configuration of the semiconductor substrate (semiconductor device) described above, the configuration of a semiconductor device described, for example, in WO 2009/153834 (especially, paragraphs 0040 to 0041, and FIG. 2E) can be referred to.

<Sealing Composition>

Next, the sealing composition used in the method of manufacturing a semiconductor device according to the first embodiment will be described.

The sealing composition used in the first embodiment is used for the purpose of forming the sealing layer 30 as a semiconductor sealing layer at least on the bottom face and the side face of the concave portion 16 of the semiconductor substrate 10, by applying the sealing composition at least on the bottom face and the side face of the concave portion 16.

The sealing composition includes polymer (A) containing a cationic functional group and having a weight average molecular weight of from 2,000 to 1,000,000, and a benzotriazole compound. The content of the polymer (A) is from 0.05 parts by mass to 0.20 parts by mass with respect to 100 parts by mass of the sealing composition, and the content of the benzotriazole compound in the sealing composition is from 3 ppm by mass to 200 ppm by mass. The sealing composition has a pH of from 3.0 to 6.5.

(Polymer (A))

The polymer (A) contains a cationic functional group, and has a weight average molecular weight of from 2,000 to 1,000,000. The polymer (A) may further contain an anionic functional group or a nonionic functional group, if necessary, as long as the polymer (A) contains at least one type of cationic functional group.

The cationic functional group is not particularly limited, as long as the cationic functional group is a functional group capable of being positively charged. Examples of the cationic functional group include amino groups and quaternary ammonium groups. Among these, the cationic functional group is preferably at least one type of group selected from a primary amino group or a secondary amino group, from the viewpoint of inhibiting the diffusion of a metal component.

The nonionic functional group may be a hydrogen bond-accepting group, or a hydrogen bond-donating group. Examples of the nonionic functional group include hydroxy group, carbonyl group, and ether group.

The anionic functional group is not particularly limited as long as the anionic functional group is a functional group capable of being negatively charged. Examples of the anionic functional group include carboxylic acid group, sulfonic acid group, and sulfuric acid group.

The polymer (A) may be a polymer having a repeating unit structure containing a cationic functional group, or alternatively, a polymer having no specific repeating unit structure but having a random structure formed by the polymerization of a monomer constituting the polymer (A) in a branched manner. It is preferable that the polymer (A) has no specific repeating unit structure, but has a random structure formed by the polymerization of a monomer constituting the polymer (A) in a branched manner, from the viewpoint of inhibiting the diffusion of a metal component.

When the polymer (A) contains a cationic functional group within one molecule, the diffusion of a metal component can be inhibited. Further, the polymer (A) is preferably a polymer having a high cation density, from the viewpoint of inhibiting the diffusion of a metal component. Specifically, the polymer (A) preferably has a cationic functional group equivalent weight of from 27 to 430, more preferably from 43 to 430, and still more preferably from 200 to 400.

Further, in a case in which the surface of the porous interlayer insulating layer is subjected to a hydrophobizing treatment by a known method, such as the method described in WO 04/026765 or WO 06/025501, the polymer (A) preferably has a cationic functional group equivalent weight of from 200 to 400, because the density of polar groups at the surface of the porous interlayer insulating layer will be decreased.

The term "cationic functional group equivalent weight" as used herein means a weight average molecular weight per cationic functional group, and is a value (Mw/n) obtained by dividing the weight average molecular weight (Mw) of the polymer (A) by the number (n) of the cationic functional groups contained in the polymer (A) equivalent to one molecule. The larger the value of the cationic functional group equivalent weight is, the lower the density of the cationic functional group is. At the same time, the smaller the value of the cationic functional group equivalent weight is, the higher the density of the cationic functional group is.

In a case in which the polymer (A) has a repeating unit structure (hereinafter also referred to as a "specific unit structure") including a cationic functional group, the cationic functional group may be included in the specific unit structure as at least a part of a main chain, or as at least a part of a side chain, or alternatively, may be included as at least a part of the main chain and at least a part of a side chain.

Further, in a case in which the specific unit structure includes two or more cationic functional groups, the two or more cationic functional groups may be the same as or different from each other.

The cationic functional group is preferably included in such a way that the ratio (hereinafter, also referred to as "relative distance between the cationic functional groups") of the length of the main chain of the specific unit structure relative to an average distance between adsorption points (for example, silanol residues) of the cationic functional groups present on the surface of the porous interlayer insulating layer is from 0.08 to 1.2, and more preferably from 0.08 to 0.6. In such an embodiment, the polymer (A) is more efficiently adsorbed on the surface of the porous interlayer insulating layer at multiple points.

The specific unit structure preferably has a molecular weight of from 30 to 500, and more preferably from 40 to 200, from the viewpoint of the adsorptivity to the interlayer insulating layer. The molecular weight of the specific unit structure means the molecular weight of a monomer constituting the specific unit structure.

From the viewpoint of the adsorptivity to the interlayer insulating layer, the specific unit structure preferably has a relative distance between the cationic functional groups of from 0.08 to 1.2, and a molecular weight of from 30 to 500; more preferably, the specific unit structure has a relative distance between the cationic functional groups of from 0.08 to 0.6, and a molecular weight of from 40 to 200.

Specific examples of the specific unit structure containing a cationic functional group include a unit structure derived from ethyleneimine, a unit structure derived from allylamine, a unit structure derived from diallyl dimethyl ammonium salt, a unit structure derived from vinylpyridine, a unit structure derived from lysine, a unit structure derived from methyl vinylpyridine, and a unit structure derived from p-vinylpyridine. Among these, the specific unit structure is preferably at least one of a unit structure derived from ethyleneimine or a unit structure derived from allylamine, from the viewpoint of adsorptivity to the interlayer insulating layer.

Further, the polymer (A) may further include at least one type of a unit structure containing a nonionic functional group or a unit structure containing an anionic functional group.

Specific examples of the unit structure containing a nonionic functional group include a unit structure derived from vinyl alcohol, a unit structure derived from alkylene oxide, and a unit structure derived from vinyl pyrrolidone.

Further, specific examples of the unit structure containing an anionic functional group include a unit structure derived from styrene sulfonic acid, a unit structure derived from vinyl sulfuric acid, a unit structure derived from acrylic acid, a unit structure derived from methacrylic acid, a unit structure derived from maleic acid, and a unit structure derived from fumaric acid.

In a case in which the polymer (A) includes two or more types of specific unit structures, the respective specific unit structures may differ in any of the type or the number of the polar groups contained therein, the molecular weight, or the like. The two or more types of the specific unit structures described above may be incorporated in the polymer (A) in the form of a block copolymer, or a random copolymer.

Further, the polymer (A) may further include at least one type of a repeating unit structure (hereinafter also referred to as a "second unit structure") other than the specific unit structure. In a case in which the polymer (A) includes a second unit structure, each of the specific unit structure and the second unit structure may be incorporated in the polymer (A) in the form of a block copolymer, or a random copolymer.

The second unit structure is not particularly limited, as long as the second unit structure is derived from a monomer which is capable of being polymerized with a monomer constituting the specific unit structure. Examples of the second unit structure include a unit structure derived from an olefin.

Further, in a case in which the polymer (A) does not have a specific repeating unit structure, but has a random structure formed by the polymerization of a monomer constituting the polymer (A) in a branched manner, the cationic functional group may be included as at least a part of the main chain, or as at least a part of a side chain, or alternatively, may be included as at least a part of the main chain and at least a part of a side chain.

Examples of the monomer capable of forming the above described polymer (A) include ethyleneimine and derivatives thereof.

Specific examples of the polymer (A) containing a cationic functional group include polyethyleneimine (PEI), polyallylamine (PAA), polydiallyl dimethyl ammonium (PDDA), polyvinyl pyridine (PVP), polylysine, polymethyl pyridyl vinyl (PMPyV), protonated poly(p-pyridyl vinylene) (R-PHPyV), and derivatives thereof. Of these, the polymer (A) is preferably polyethyleneimine (PEI) or a derivative thereof, polyallylamine (PAA), or the like, and more preferably, polyethyleneimine (PEI) or a derivative thereof.

In general, polyethyleneimine (PEI) can be produced by polymerizing ethyleneimine, using an ordinary method. A polymerization catalyst, polymerization conditions and the like can also be selected as appropriate from those generally used for the polymerization of ethyleneimine. Specifically, the reaction can be carried out, for example, at a temperature of from 0° C. to 200° C. in the presence of an effective amount of acid catalyst, such as hydrochloric acid. Further, polyethyleneimine as a basis may be subjected to an addition-polymerization with ethyleneimine. Polyethyleneimine may be a homopolymer of ethyleneimine, or may be a copolymer of ethyleneimine and a compound capable of copolymerizing with ethyleneimine, such as an amine. Regarding the method for producing such polyethyleneimine, for example, Japanese Patent Publication (JP-B) No. S43-8828, JP-B No. S49-33120, and the like can be referred to.

It is also possible to produce polyethyleneimine from crude ethyleneimine obtained from monoethanolamine. Specifically, Japanese Patent Application Laid-Open (JP-A) No. 2001-2123958 and the like can be referred to, for example.

Polyethyleneimine produced as described above has a complex skeleton which includes not only a partial structure in which ring-opened ethyleneimines are linked to form a straight chain, but also a partial structure in which ring-opened ethyleneimines are linked to form a branched chain, and a partial structure in which the straight-chain partial structures are crosslinked to each other. When the polymer (A) containing a cationic functional group and having such a structure is used, the polymer (A) is more efficiently adsorbed at multiple points. Further, the interaction between the polymers allows for a more effective formation of a sealing layer.

It is also preferable that the polymer (A) is a polyethyleneimine derivative. The polyethyleneimine derivative is not particularly limited, as long as the polyethyleneimine derivative is a compound which can be produced using the above described polyethyleneimine. Specific examples thereof include a polyethyleneimine derivative obtained by introducing an alkyl group (preferably, an alkyl group having from 1 to 10 carbon atoms) or an aryl group into polyethyleneimine, and a polyethyleneimine derivative obtained by introducing a crosslinking group such as hydroxyl group into polyethyleneimine.

These polyethyleneimine derivatives can be produced by an ordinary method using polyethyleneimine. Specifically, these polyethyleneimine derivatives can be produced in accordance with the method disclosed in, for example, JP-A No. H6-016809 or the like.

Further, the above described polyethyleneimine and derivatives thereof may be commercially available products. For example, any products selected as appropriate from polyethyleneimines and derivatives thereof available from NIPPON SHOKUBAI CO., LTD., BASF JAPAN LTD., and the like can be used.

The weight average molecular weight of the polymer (A) is from 2,000 to 1,000,000, preferably from 2,000 to 600,000, more preferably from 2,000 to 300,000, still more preferably from 2,000 to 100,000, yet still more preferably from 10,000 to 80,000, and particularly preferably from 20,000 to 60,000. When the polymer (A) has a weight average molecular weight of from 2,000 to 1,000,000, an excellent covering property (sealing property) for covering the concave portion 16 in the interlayer insulating layer can be obtained, thereby reducing a decrease in the dielectric constant when a polymer layer (sealing layer) is formed.

For example, when the polymer (A) has a weight average molecular weight of greater than 1,000,000, the size of the polymer molecule exceeds the size of the concave portion 16, making the polymer (A) unable to enter the concave portion 16, and as a result, the covering property for covering the concave portion 16 may be decreased.

When the polymer (A) has a weight average molecular weight of less than 2,000, on the other hand, the molecules of the polymer (A) may not be adsorbed on the interlayer insulating layer at multiple points. In addition, the size of the polymer molecules becomes smaller than the diameter of the pores in the interlayer insulating layer, allowing resin molecules to penetrate into the pores of the interlayer insulating layer, and as a result, the dielectric constant of the interlayer insulating layer may be increased.

Note that, the weight average molecular weight and a molecular weight distribution refer to the weight average molecular weight and the molecular weight distribution in terms of polyethylene glycol, as measured by GPC (Gel Permeation Chromatography) method.

Specifically, the weight average molecular weight and the molecular weight distribution are measured using an aqueous solution having an acetic acid concentration of 0.5 mol/L and a sodium nitrate concentration of 0.1 mol/L as an eluent, an analyzer, SHODEX GPC-101, and a column, ASAHIPAK GF-7M HQ, and are calculated using polyethylene glycol as a reference standard.

The polymer (A) is also preferably a polymer which has a critical micelle concentration in an aqueous medium of 1% by mass or more, or a polymer which does not substantially form a micelle structure. The expression "does not substantially form a micelle structure" as used herein means that micelles are not formed under ordinary conditions, such as in an aqueous medium at a normal temperature, namely that the critical micelle concentration cannot be measured. When the polymer has such a feature, it is possible to form a thin polymer layer having a thickness of molecular level (for example, 5 nm or less), and to effectively reduce an increase in the dielectric constant of the interlayer insulating layer. Further, the adhesion between the interlayer insulating layer and a wiring material is more effectively improved.

Further, the polymer (A) is preferably polyethyleneimine having a weight average molecular weight of from 2,000 to 600,000 and a cationic functional group equivalent weight of from 43 to 430, and more preferably polyethyleneimine having a weight average molecular weight of from 10,000 to 80,000 and a cationic functional group equivalent weight of from 200 to 400. In such an embodiment, the diffusion of a metal component into the interlayer insulating layer is more effectively reduced, and the adhesion between the interlayer insulating layer and a wiring material is further improved.

The content of the polymer (A) in the sealing composition is from 0.05 parts by mass to 0.20 parts by mass, preferably from 0.08 parts by mass to 0.19 parts by mass, and more preferably from 0.11 parts by mass to 0.18 parts by mass, with respect to 100 parts by mass of the sealing composition. Further, the content of the polymer (A) in the sealing composition can be adjusted based on an area and a pore density of the face on which the polymer layer is to be formed using the sealing composition. When the content of the polymer (A) in the sealing composition is 0.05 parts by mass or more, the sealing property of the sealing composition can be suitably maintained. When the content of the polymer (A) in the sealing composition is 0.20 parts by mass or less, on the other hand, it is possible to reduce the amount of the sealing composition adhered on the bottom face of the concave portion and the surface of the wiring, thereby improving the removability of the sealing composition on the bottom face of the concave portion and on the surface of the wiring.

(Benzotriazole Compound)

By incorporating a benzotriazole compound into the sealing composition, a hydrophobic group is formed on the surface of the wiring containing copper and the like, when the sealing composition is applied on the surface. It is thought that the formation of the hydrophobic group serves to more effectively inhibit the adhesion of the polymer (A) to the surface of the wiring, and thereby making the polymer (A) in the sealing composition less likely to adhere to the surface of the wiring.

The benzotriazole compound as used herein is a compound having a benzotriazole skeleton. Specific examples of the benzotriazole compound include benzotriazole (BTA: 1,2,3-benzotriazole), 5,6-dimethylbenzotriazole (DBTA), 1-(1,2-dicarboxyethyl)benzotriazole (DCEBTA), 1-[N,N-bis(hydroxyethyl)aminomethyl]benzotriazole (HEABTA), 1-(hydroxymethyl)benzotriazole (HMBTA), 5-methylbenzotriazole, 1H-benzotriazol-5-carboxylic acid, carboxybenzotriazole, 4,5-dimethylbenzotriazole, 2-(3,5-di-t-butyl-2-hydroxyphenyl)benzotriazole, and derivatives thereof. The benzotriazole compound to be contained in the sealing composition may be one of the compounds exemplified above, or two or more types thereof.

Further, the content of the benzotriazole compound in the sealing composition is from 3 ppm by mass to 200 ppm by mass, preferably from 3 ppm by mass to 100 ppm by mass, and more preferably from 3 ppm by mass to 30 ppm by mass. When the content of the benzotriazole compound is from 3 ppm by mass or more, the dissolution of a wiring material such as copper can be inhibited. When the content of the benzotriazole compound is 200 ppm by mass or less, the decrease in the sealing property of the sealing composition can be reduced.

(Acid)

The sealing composition according to the first embodiment preferably contains at least one type of acid.

This embodiment is suitable in the case of adjusting the pH of the sealing composition according to the first embodiment to the acidic side. The preferred pH range of the sealing composition is as described later.

The acid is not particularly limited, and examples thereof include monocarboxylic acid compounds, dicarboxylic acid compounds, and oxydicarboxylic acid compounds.

Examples of the monocarboxylic acid compound include aliphatic monocarboxylic acid compounds (such as formic acid, acetic acid, propionic acid, butyric acid, methoxyacetic acid, ethoxyacetic acid, lactic acid, glycolic acid, and glyceric acid), and aromatic monocarboxylic acid compounds (such as benzoic acid, picolinic acid, salicylic acid, and 3,4,5-trihydroxybenzoic acid).

Among the above mentioned compounds, the acid is preferably a monocarboxylic acid compound, more preferably an aliphatic monocarboxylic acid compound, and particularly preferably formic acid or acetic acid, from the viewpoint of effectively balancing making the polymer (A) less likely to remain on the surface of the wiring, and making the polymer (A) more likely to remain on the interlayer insulating layer.

As the monocarboxylic acid compound, a monocarboxylic acid compound (hereinafter, also referred to as a "specific monocarboxylic acid compound") which contains neither a hydroxyl group nor an amino group, and which has a van der Waals volume of 40 cm$^3$/mol or more is also preferred.

Incorporation of the specific monocarboxylic acid compound into the sealing composition has an advantage of making the polymer (A) contained in the sealing composition less likely to adhere to the surface of the wiring, in the sealing composition application process in which the sealing composition containing polymer (A) is applied to the surface of the wiring. The reason for this is not clear; however, it is assumed to be as follows. The specific monocarboxylic acid compound having a van der Waals volume of 40 cm$^3$/mol or more includes a bulky hydrophobic group and one carboxyl group. It is thought that, when the sealing composition containing the specific monocarboxylic acid compound and the polymer (A) is applied to the surface of the wiring containing copper and the like, the carboxyl group in the specific monocarboxylic acid compound reacts with copper of the surface of the wiring to cause the surface of the wiring to be covered with bulky hydrophobic groups, and as a result, the surface of the wiring is hydrophobized. At this time, the surface of the wiring is more strongly hydrophobized (in other words, a surface energy is reduced), perhaps because the hydrophobic groups covering the surface of the wiring are bulky. Further, the surface of the wiring is thought to be maintained more hydrophobic, since the specific monocarboxylic acid contains neither a hydroxyl group nor an amino group. For these reasons, it is thought that the adhesion of the polymer (A) to the surface of the wiring is more effectively inhibited, thereby making the polymer (A) in the sealing composition less likely to adhere to the surface of the wiring.

In a case in which the sealing composition contains the specific monocarboxylic acid compound, there is an advantage, when described with reference to FIG. 1, for example, that the polymer layer is less likely to be formed on the exposed face 20a, in the process of applying the sealing composition to the exposed face 20a.

Accordingly, it is possible, for example, to omit the treatment for removing the polymer layer formed on the exposed face 20a. For example, even in a case in which the treatment for removing the polymer layer is omitted, it is possible to obtain a semiconductor substrate in which the polymer layer is formed on the exposed faces of the respective insulating layers, but the exposed face 20a is left uncovered with the polymer layer.

As the numerical value of the van der Waals volume of the specific monocarboxylic acid compound, the value described in "Chemical Properties Handbook" (edited by YAWS, published by McGraw Hill) is used.

The specific monocarboxylic acid compound more preferably has a van der Waals volume of from 40 cm$^3$/mol to 85 cm$^3$/mol.

Specifically, the specific monocarboxylic acid compound (the monocarboxylic acid compound which contains neither a hydroxyl group nor an amino group, and which has a van der Waals volume of 40 cm$^3$/mol or more) is preferably propionic acid, picolinic acid, butyric acid, valeric acid, hexanoic acid, heptanoic acid, acrylic acid, or the like. Propionic acid or picolinic acid is particularly preferred.

Further, since the sealing composition contains a benzotriazole compound, it is possible to make the polymer (A) less likely to adhere to the surface of the wiring in the sealing composition application process, even in a case in which formic acid or acetic acid is used instead of the specific monocarboxylic acid compound.

The contents of sodium and potassium in the sealing composition are each 10 ppb or less on an elemental basis. The contents each being "10 ppb or less" means that sodium and potassium are not positively included. Due to containing sodium and potassium each in a content of 10 ppb or less, on an elemental basis, the occurrence of leakage current can be reduced.

The sealing composition may contain a solvent in addition to the polymer (A), if necessary. At least in the sealing composition application process, the sealing composition contains a solvent. The solvent is not particularly limited, as long as the solvent allows the polymer (A) to be uniformly dissolved therein, and the solvent is less likely to cause the formation of micelles. Examples of the solvent include water (preferably, ultrapure water), and water-soluble organic solvents (such as alcohols). It is preferable to use water, or a mixture of water with a water-soluble organic solvent, as the solvent, from the viewpoint of micelle forming property.

The boiling point of the solvent is not particularly limited, but the boiling point is preferably 210° C. or lower, and more preferably 160° C. or lower. In the case of performing a cleaning process and/or a drying process after the sealing composition application process, for example, a boiling point of the solvent within the above range makes it possible to remove the solvent and to form a semiconductor sealing layer, without significantly compromising the insulating property of the interlayer insulating layer, and at a low temperature which does not cause the separation of the sealing composition from the interlayer insulating layer.

The sealing composition may further contain a cation such as cesium ion, if necessary, to the extent that the effect of the invention is not impaired. When a cation such as cesium is contained, the resin in the sealing composition is more easily and uniformly spread on the surface of the interlayer insulating layer.

Further, it is preferable not to incorporate a compound (such as a fluorine compound) which causes corrosion or dissolution of the interlayer insulating layer to the sealing composition. Specifically, in a case in which the main component of the interlayer insulating layer is an inorganic compound such as silica, for example, when the fluorine compound or the like is contained in the sealing composition, the interlayer insulating layer may be dissolved to lose its insulating property, thereby resulting in an increase in the dielectric constant.

It is preferable that the sealing composition solely contains a compound having a boiling point of 210° C. or lower, and preferably 160° C. or lower, or alternatively, a compound which does not decompose, even when subjected to a heat treatment of up to 250° C.

Note that the "compound which does not decompose, even when subjected to a heat treatment of up to 250° C." refers to a compound in which the change in its mass measured after being maintained at 250° C. under nitrogen for 1 hour, with respect to the mass measured at 25° C., is less than 50%

The sealing composition preferably has a pH of from 3.0 to 6.5, and preferably from 3.5 to 6.0. The polymer (A) contains a cationic functional group as a polar group, and the sealing composition has a pH range within which the cationic functional group is in the form of a cation. Thus, the polymer (A) is more efficiently absorbed to the surface of the interlayer insulating layer, due to an electrostatic interaction between the interlayer insulating layer and the polymer (A). In addition, when the sealing composition has a pH within the above range, the polymer (A) is less likely to adhere to the wiring containing copper and the like, and as a result, the polymer (A) is much less likely to remain on the surface of the wiring.

Note that, the "pH range within which the cationic functional group is in the form of a cation" refers to a state in which the pH of the sealing composition is equal to or less than the pKa of the resin containing the cationic functional group. For example, in a case in which the resin containing the cationic functional group is polyallylamine, the resin has a pKa of from 8 to 9, and in a case in which the resin is polyethyleneimine, the resin has a pKa of from 7 to 11.

The pH (at 25° C.) is measured with a commonly used pH measuring apparatus.

[Pretreatment Process]

Before carrying out the sealing composition application process, at least the face onto which the sealing composition is applied, of the surfaces of the wiring containing copper and the like, may be subjected to a pretreatment process.

It is preferable that the above described pretreatment is carried out using a chelating agent which forms a hydrophobic group on the surface of the wiring, such as a benzotriazole compound, phenanthroline, bipyridine, tripyridine, acetylacetone, triaminopropane, or 8-quinolinol; or an acid which forms a hydrophobic group on the surface of the wiring, such as a saturated aliphatic monocarboxylic acid (propionic acid, butyric acid, valeric acid, hexanoic acid, heptanoic acid, octanoic acid, nonanoic acid, decanoic acid, lauric acid, tridecanoic acid, myristic acid, pentadecanoic acid, palmitic acid, heptadecanoic acid, stearic acid, or the like), an unsaturated aliphatic monocarboxylic acid (acrylic acid, α-linolenic acid, linoleic acid, oleic acid, or the like), an aromatic monocarboxylic acid (benzoic acid, salicylic acid, or the like), phthalic acid, or picolinic acid. In particular, the above described pretreatment is preferably carried out using a benzotriazole compound.

The pretreatment is carried out using an ordinary method, and may be carried out either by a liquid phase method or a vapor phase method.

By carrying out the pretreatment, only the surface of the wiring can be made hydrophobic, thereby reducing the interaction between the surface of the wiring and the sealing composition, which in turn further inhibits the adhesion of the composition to the surface of the wiring. As a result, an improved selectivity can be obtained, when allowing the polymer (A) to remain on the interlayer insulating layer.

[Cleaning Process]

The method of manufacturing a semiconductor device according to the first embodiment includes a cleaning process in which at least the side face and the bottom face of the concave portion are cleaned with a rinsing liquid containing a polyvalent carboxylic acid monomer in an amount of from 0.3 millimole/liter to 230 millimole/liter, and which is carried out after the sealing composition application process.

By including the cleaning process, the removability of the portion of the sealing layer on the exposed face of the wiring is further improved.

The above described rinsing liquid is a liquid containing a polyvalent carboxylic acid monomer in an amount of from 0.3 millimole/liter to 230 millimole/liter. When the rinsing liquid contains a polyvalent carboxylic acid monomer in an amount of 230 millimole/liter or less, it is possible to further reduce the dissolution of copper contained in the wiring and of the interlayer insulating layer. When the rinsing liquid contains a polyvalent carboxylic acid monomer in an amount of 0.3 millimole/liter or more, a plasma resistance of the sealing layer to be described later can be improved.

The content of the polyvalent carboxylic acid monomer in the rinsing liquid is preferably from 0.5 millimole/liter to 200 millimole/liter, and more preferably from 0.6 millimole/liter to 100 millimole/liter.

The rinsing liquid is not particularly limited as long as the rinsing liquid contains a specified amount of polyvalent carboxylic acid monomer. However, it is preferable that the rinsing liquid contains a solvent having a high polarity, from the viewpoint of improving the cleaning efficiency.

Since the sealing composition has a high polarity due to including the polymer (A) containing a cationic functional group, the sealing composition is easily dissolved in a solvent having a high polarity. Thus, the use of the rinsing liquid containing a solvent having a high polarity serves to further improve the removability of the portion of the sealing layer on the exposed face of the wiring.

Specifically, it is preferable that the rinsing liquid contains a polar solvent such as water, methanol, ethanol, propanol, butanol, or propylene glycol monomethyl ether acetate.

Such a polar solvent does not significantly interfere with the interaction between the interlayer insulating layer and the sealing composition. Therefore, the rinsing liquid containing such a polar solvent is preferred, because the portion of the sealing layer (the portion of the sealing layer which is effectively functioning) formed on the interlayer insulating layer is not easily removed when the cleaning is carried out using such a rinsing liquid.

The rinsing liquid may contain only one type of polar solvent, or may contain two or more types of polar solvents.

The temperature of the rinsing liquid in the present process is preferably from 15° C. to 100° C., more preferably from 30° C. to 100° C., still more preferably from 40° C. to 100° C., and particularly preferably from 50° C. to 100° C.

When the temperature of the rinsing liquid is 15° C. or higher (more preferably, 30° C. or higher), the removability of the portion of the sealing layer on the exposed face of the wiring is further improved.

When the temperature of the rinsing liquid is 100° C. or lower, the evaporation of the rinsing liquid can be further reduced.

Further, the cleaning in the present process may be carried out while applying ultrasonic wave to the rinsing liquid.

In addition, the rinsing liquid preferably contains a reducing agent or a compound having a reducing action, from the viewpoint of inhibiting the oxidation of a wiring material containing copper. Examples of the reducing agent or the compound having a reducing action include formalin.

Further, the rinsing liquid preferably contains an oxidative compound (such as hydrogen peroxide or nitric acid) in an amount of 10% by mass or less, and more preferably, contains no oxidative compound, from the viewpoints of preventing the cleavage of a carbon bond and the like in the polymer (A) in the sealing composition, and preventing the separation of the portion of the sealing layer (the portion of the sealing layer which is effectively functioning) provided on the surface of the interlayer insulating layer.

In addition, the rinsing liquid preferably has an ionic strength of 0.003 or more, and more preferably, 0.01 or more.

An ionic strength of 0.003 or more is preferred, because the sealing layer (the polymer layer) can be more easily dissolved, and at the same time, the interaction between the interlayer insulating layer and the sealing layer is not significantly impaired.

The upper limit of the ionic strength is not particularly limited, as long as the upper limit is an ionic strength of a concentration at which an ionic compound can be dissolved.

Note that the ionic strength is expressed by the following equation:

$$\text{Ionic strength} = \tfrac{1}{2} \times \Sigma(c \times Z^2)$$

(wherein c represents a molar concentration of the ionic compound contained in the rinsing liquid, and Z represents an ionic valence of the ionic compound contained in the rinsing liquid).

In order to adjust the ionic strength, it is possible to add an ionic compound such as an acid to be described later or an organic base (ammonia, pyridine, ethylamine, or the like), if necessary.

Further, it is also preferable that the rinsing liquid is a rinsing liquid having a pH at 25° C. of 7.0 or lower (preferably 6.0 or lower). The use of such a rinsing liquid serves to further improve the removability of the portion of the sealing layer on the exposed face of the wiring. Still further, a copper oxide formed on the exposed face of the wiring can be dissolved and removed.

In this case, the lower limit of the pH of the rinsing liquid is not particularly limited, but the pH is preferably 4.0 or higher, and more preferably 5.0 or higher. When the rinsing liquid has a pH of 4.0 or higher, the portion of the sealing layer formed on the side face of the concave portion of the interlayer insulating layer is easily maintained, and as a result, it is possible to maintain the sealing property which prevents the penetration of a wiring material (such as copper) into the interlayer insulating layer. When the rinsing liquid has a pH of 5.0 or higher, the dissolution of copper contained in the wiring can be further reduced.

The rinsing liquid preferably has a pH of from 4.0 to 7.0, and more preferably from 5.0 to 6.0, from the viewpoint of effectively balancing the removability of the portion of the sealing layer formed on the exposed face of the wiring, and the maintenance of the portion of the sealing layer provided on the surface of the interlayer insulating layer.

Further, in the production process of a semiconductor device, the semiconductor device may be subjected to cleaning by plasma with its sealing layer exposed, or a layer may be formed on the sealing layer by a plasma CVD method or the like.

Therefore, the sealing layer may be required to have a plasma resistance.

From the viewpoint of improving the plasma resistance of the sealing layer, the rinsing liquid contains at least one type of polyvalent carboxylic acid monomer. The polyvalent carboxylic acid monomer is not particularly limited, as long as the monomer contains a plurality of carboxylic acid groups. However, the polyvalent carboxylic acid monomer is preferably a polyvalent carboxylic acid monomer which is less likely to contaminate or cause damages to the interlayer insulating layer, and which is less likely to remain on the semiconductor substrate.

Since the polyvalent carboxylic acid monomer includes carboxyl groups, in a case in which the sealing layer includes a polymer (such as polyethyleneimine) which contains at least one of a primary amino group or a secondary amino group (imino group), for example, the carboxyl groups react with at least one of the primary amino group or the secondary amino group (imino group) in the polymer, thereby forming an amide bond or an imide bond.

This serves to further improve the plasma resistance of the sealing layer.

In the polyvalent carboxylic acid monomer, the number of carboxyl groups within one molecule is more preferably two or more, still more preferably three or more, and particularly preferably four or more.

The number of the carboxyl groups is not particularly limited, and the number can be, for example, six or less.

Specific examples of the polyvalent carboxylic acid monomer include dicarboxylic acids such as oxalic acid, malonic acid, succinic acid, glutaric acid, adipic acid, pimelic acid, maleic acid, fumaric acid and phthalic acid; tricarboxylic acids such as trimellitic acid and tricarballylic acid; oxydicarboxylic acids such as malic acid and tartaric acid; oxytricarboxylic acids such as citric acid; and aminocarboxylic acids such as aspartic acid and glutamic acid. It is possible to suitably improve the plasma resistance of the sealing layer, by including such a polyvalent carboxylic acid monomer.

The polyvalent carboxylic acid monomer is still more preferably a polyvalent carboxylic acid monomer such as naphthalene tetracarboxylic acid (for example, naphthalene-2,3,6,7-tetracarboxylic acid or naphthalene-1,4,5,8-tetracarboxylic acid), biphenyl tetracarboxylic acid (for example, 3,3',4,4'-biphenyl tetracarboxylic acid), benzophenone tetracarboxylic acid (for example, 3,3',4,4'-benzophenone tetracarboxylic acid), benzene hexacarboxylic acid, pyromellitic acid, trimellitic acid (namely, 1,2,4-benzene tricarboxylic acid), diphenyl ether tetracarboxylic acid (3,3', 4,4'-diphenyl ether tetracarboxylic acid), phenylene diacetic acid (for example, metaphenylene diacetic acid or orthophenylene diacetic acid), bicyclo[2.2.2]oct-7-ene-2,3,5,6-tetracarboxylic acid, ethylenediamine tetraacetic acid, citric acid, meso-butane-1,2,3,4-tetracarboxylic acid, polyacrylic acid, 4,4-oxydiphthalic acid, or 1,3,5-benzene tricarboxylic acid.

The polyacrylic acid preferably has a weight average molecular weight of from 1,000 to 800,000, more preferably from 1,000 to 600,000, still more preferably from 1,000 to 200,000, yet still more preferably from 5,000 to 80,000, yet still more preferably from 10,000 to 50,000, and particularly preferably from 20,000 to 30,000. The weight average molecular weight of the polyacrylic acid is measured in the same manner as the weight average molecular weight of the polymer contained in the sealing layer.

It is also preferable that the polyvalent carboxylic acid monomer is a compound which contains two or more carboxyl groups within one molecule, and which has a structure in which a carboxyl group is bound to each of two adjacent carbon atoms, or a structure in which a carboxyl group is bound to each of the carbon atoms located at respective ends of three consecutive carbon atoms.

Accordingly, particularly in a case in which the sealing layer includes a polymer (such as polyethyleneimine) which contains at least one of a primary amino group or a secondary amino group (imino group), an imide bond is more effectively formed due to the reaction between the carboxyl groups in the polyvalent carboxylic acid monomer and at least one of the primary amino group or the secondary amino group (imino group) in the polymer. As a result, the plasma resistance of the sealing layer is further improved.

Examples of the structure in which a carboxyl group is bound to each of two adjacent carbon atoms include a structure of citric acid, a structure in which a carboxyl group is bound to the ortho position of a benzene ring, and a structure in which a carboxyl group is bound to 2- and 3-positions (or alternatively, 6- and 7-positions) of a naphthalene ring.

Examples of the structure in which a carboxyl group is bound to each of the carbon atoms located at respective ends of three consecutive carbon atoms include a structure in which a carboxyl group is bound to 1- and 8-positions (or alternatively, 4- and 5-positions) of a naphthalene ring.

In this case, the polyvalent carboxylic acid monomer is particularly preferably 3,3',4,4'-diphenyl ether tetracarboxylic acid, 3,3',4,4'-biphenyl tetracarboxylic acid, 3,3',4,4'-benzophenone tetracarboxylic acid, naphthalene-2,3,6,7-tetracarboxylic acid, naphthalene-1,4,5,8-tetracarboxylic acid, benzene hexacarboxylic acid, pyromellitic acid, trimellitic acid, bicyclo[2.2.2]oct-7-ene-2,3,5,6-tetracarboxylic acid, meso-butane-1,2,3,4-tetracarboxylic acid, or citric acid.

The polyvalent carboxylic acid monomer is preferably an aromatic cyclic polyvalent carboxylic acid monomer. The aromatic cyclic polyvalent carboxylic acid monomer is particularly preferably, for example, naphthalene tetracarboxylic acid, biphenyl tetracarboxylic acid, benzophenone tetracarboxylic acid, benzene hexacarboxylic acid, pyromellitic acid, trimellitic acid, diphenyl ether tetracarboxylic acid, or phenylene diacetic acid. Further, the polyvalent carboxylic acid monomer is more preferably a compound which contains one or more of either a benzene ring or naphthalene within one molecule, which contains three or more carboxyl groups, and which has a structure in which a carboxyl group is bound to each of two adjacent carbon atoms. Still further, the polyvalent carboxylic acid monomer is particularly preferably a compound which satisfies at least one of the following: having two aromatic rings, or having a molecular weight of 342 or more.

Examples of particularly preferred polyvalent carboxylic acid monomers include naphthalene tetracarboxylic acid (such as naphthalene-2,3,6,7-tetracarboxylic acid, and naphthalene-1,4,5,8-tetracarboxylic acid), biphenyl tetracarboxylic acid (such as 3,3',4,4'-biphenyl tetracarboxylic acid), benzophenone tetracarboxylic acid (such as 3,3',4,4'-benzophenone tetracarboxylic acid), benzene hexacarboxylic acid, and diphenyl ether tetracarboxylic acid (such as 3,3',4,4'-diphenyl ether tetracarboxylic acid).

Note that, the above described polyvalent carboxylic acid monomer may be partially esterified.

From the viewpoint of imparting the plasma resistance to the sealing layer, the above described rinsing liquid can be used for cleaning the portion of the sealing layer provided on a portion other than the concave portion, or a sealing layer provided on a semiconductor substrate in which wiring containing copper is not exposed.

Examples of the plasma include plasma generated from hydrogen gas, helium gas, argon gas, nitrogen gas, ammonia gas, or the like. Conditions for generating the plasma are not particularly limited; however, preferred conditions are those in which the portion of the polymer layer (sealing layer) which is deposited at least on the side face of the concave portion and which significantly contributes to the sealing function is not excessively removed. Examples of such conditions include conditions such as a total pressure of from 20 mTorr to 200 mTorr, a gas flow rate of from 20 sccm to 100 sccm, a cathode electrode diameter of from 5 cm to 15 cm, a discharge electric power of from 20 W to 200 W, and a treatment time (discharge time) of from 10 sec to 60 sec.

The amounts of the solvent, the polyvalent carboxylic acid, the reducing agent, and the ionic compound described above, which may be contained in the rinsing liquid, are not particularly limited. For example, these amounts may be adjusted as appropriate, such that the pH and the ionic strength of the rinsing liquid fall within the above mentioned preferred ranges.

The rinsing liquid can be prepared, for example, by mixing the solvent, the polyvalent carboxylic acid, the reducing agent, the ionic compound, and the like. However, in order to prevent the contamination of a semiconductor circuit, it is preferable to prepare the rinsing liquid under a clean environment, for example, in a clean room, or alternatively, to remove components which contaminate the semiconductor circuit by purification, filtration, or the like, after preparing the rinsing liquid.

By carrying out a process (high temperature heating process) of heating at a temperature of from 200° C. to 425° C. to be described later after the cleaning process, it is possible to swiftly remove and clean (rinse) an unnecessary portion of the sealing layer formed on the wiring, using the rinsing liquid, while maintaining an effective portion of the sealing layer sealing the interlayer insulating layer. Further, it is also possible to remove an oxide of a wiring material, as described above, and thereby preventing the separation between the wiring material and a low dielectric constant material, or between the wiring materials.

In addition, it is also preferable that the cleaning in the present process is carried out under a non-oxidizing atmosphere. When the cleaning is carried out under a non-oxidizing atmosphere, it is possible to prevent the copper wiring from being removed excessively, due to the repetition of the following cycles: first, copper oxide which is present on the surface of the wiring before the rinsing is removed with the rinsing liquid, and then copper of the surface of the wiring is further oxidized to form copper oxide, and this newly formed copper oxide is again dissolved (removed) with the rinsing liquid. A non-oxidizing atmosphere can be prepared by using, for example, a reducing atmosphere gas.

The cleaning in the present process can be carried out by an ordinary method, and the method is not particularly limited.

The cleaning time is not particularly limited. For example, the cleaning time may be from 0.1 minutes to 60 minutes, and more preferably from 0.1 minutes to 10 minutes.

[Heating Process]

The method of manufacturing a semiconductor device according to the first embodiment preferably includes a heating process (soft bake process) in which heating is carried out at a temperature of from 70° C. to 125° C., and which is carried out after the sealing composition application process and before the cleaning process. The above described temperature is a temperature of the face of the semiconductor substrate on the side on which the sealing layer has been formed.

By including the heating process, it is possible to effectively balance making the polymer (A) less likely to remain on the wiring, and making the polymer (A) more likely to remain on the interlayer insulating layer.

Specifically, when the temperature is 70° C. or higher, the capability of the polymer (A) applied to the interlayer insulating layer to remain thereon is suitably maintained. Further, when the temperature is 125° C. or lower, it is possible to make the polymer (A) much less likely to remain on the wiring.

The above described temperature is more preferably from 80° C. to 120° C., still more preferably from 85° C. to 120° C., yet still more preferably from 90° C. to 115° C., and particularly preferably from 90° C. to 110° C.

The heating in the present process can be carried out by an ordinary method, using a hot plate, for example.

The atmosphere for carrying out the heating in the present process is not particularly limited. For example, the heating may be carried out under an air atmosphere, or may be carried out under an inert gas (such as nitrogen gas, argon gas, or helium gas) atmosphere.

The heating time is not particularly limited; however the heating time is preferably from 300 seconds or less, more preferably 200 seconds or less, still more preferably 120 seconds or less, and particularly preferably 80 seconds or less.

The lower limit of the heating time is not particularly limited, and the lower limit can be, for example, 10 seconds (preferably 20 seconds, and more preferably 30 seconds).

[High Temperature Heating Process]

The method of manufacturing a semiconductor device according to the first embodiment preferably includes a high temperature heating process which is carried out after the cleaning process, and in which heating is carried out at a temperature of from 200° C. to 425° C.

The present process allows the portion of the sealing layer formed on the exposed face of the wiring containing copper to be preferentially removed (preferably, selectively with respect to the portion of the sealing layer formed on a portion (such as the side face of the concave portion) other than the exposed face), before the portion of the sealing layer formed on the portion other than the exposed face is removed.

The above mentioned temperature is a temperature of the face of the semiconductor substrate on the side on which the sealing layer has been formed.

When the temperature is 200° C. or higher, the portion of the sealing layer formed on the exposed face of the wiring can be suitably removed.

Further, when the temperature is 425° C. or lower, the migration of copper contained in the wiring can be inhibited.

The temperature is preferably from 250° C. to 400° C., and more preferably from 300° C. to 400° C.

The pressure under which the heating in the high temperature heating process is carried out (the pressure of an atmosphere to which the sealing layer is exposed during the heating) is not particularly limited. However, an absolute pressure of higher than 17 Pa but equal to or lower than the atmospheric pressure is preferred.

When the absolute pressure is higher than 17 Pa, the speed of removing the portion of the sealing layer formed on the exposed face of the wiring is further increased.

When the absolute pressure is equal to or lower than the atmospheric pressure, the speed of removing the portion of the sealing layer formed on the exposed face of the wiring is more easily adjusted.

The absolute pressure is more preferably from 1,000 Pa to the atmospheric pressure, still more preferably from 5,000 Pa to the atmospheric pressure, and particularly preferably from 10,000 Pa to the atmospheric pressure.

The heating in the present process can be carried out by an ordinary method using an oven or a hot plate. As the oven, SPX-1120 manufactured by APEX Co., Ltd., or VF-1000LP manufactured by Koyo Thermo Systems Co., Ltd., for example, can be used.

Further, the heating in the present process may be carried out in an air atmosphere. However, the heating is more preferably carried out under an inert gas (such as nitrogen gas, argon gas, or helium gas) atmosphere, and particularly preferably, under a nitrogen gas atmosphere, from the viewpoint of inhibiting the oxidation of copper as a wiring material.

The heating time in the high temperature heating process is not particularly limited, and the heating time is, for example, 1 hour or less, preferably 30 minutes or less, more preferably 10 minutes or less, and particularly preferably 5 minutes or less. The lower limit of the heating time is not particularly limited, and the lower limit can be, for example, 0.1 minutes.

When the heating time is 1 hour or less, the sealing property of the sealing layer for sealing the interlayer insulating layer is highly maintained.

In a case in which the method of manufacturing a semiconductor device according to the first embodiment includes the above described heating process (soft bake process), and the high temperature heating process (hard bake process), it is preferable to carry out the sealing composition application process, the heating process (soft bake process), the cleaning process, and the high temperature heating process (hard bake process), in this order.

Figure 3:
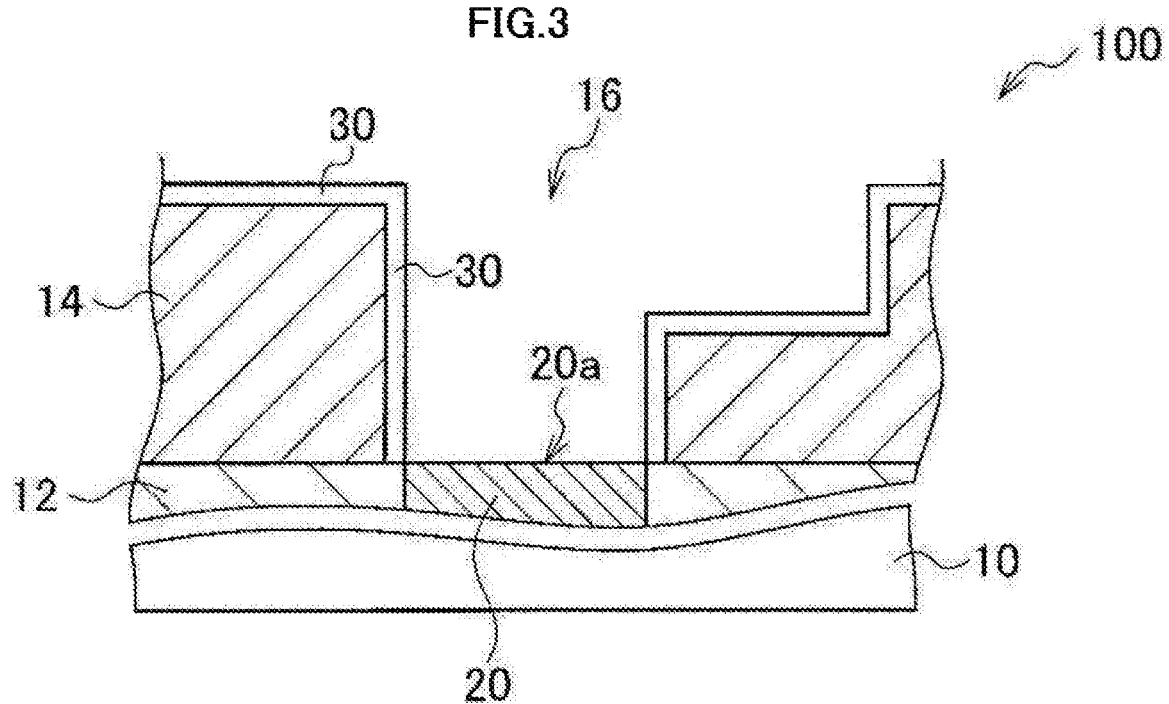
FIG. 3 is a conceptual sectional diagram schematically showing a cross section of the semiconductor substrate, when the portion of a semiconductor sealing layer formed on an exposed face of wiring has been removed, in the method of manufacturing a semiconductor device according to the first embodiment.

FIG. 3 is the conceptual sectional diagram schematically showing the cross section of the semiconductor substrate when the portion of the semiconductor sealing layer formed on the exposed face of the wiring is removed.

FIG. 2 shows the cross section of the semiconductor substrate after being subjected to the sealing composition application process, and by cleaning the face of this semiconductor substrate on the side on which the sealing layer 30 has been formed, with the rinsing liquid in the cleaning process, the removability of the portion of the sealing layer 30 formed on the exposed face of the wiring 20 is improved. Then, this portion of the sealing layer 30 can further be removed by the high temperature heat treatment.

At this time, it is not necessary to remove the entire portion of the semiconductor sealing layer formed on the exposed face 20a, and the semiconductor sealing layer may be removed to the extent that the remaining portion of the sealing layer does not cause an increase in a connection resistance between the wiring 20 and wiring (such as the first wiring 40 shown in FIG. 4 to be described later) to be embedded in the concave portion 16 in the subsequent process.

As described above, it is possible to remove at least a part of the portion of the sealing layer 30 formed on the wiring 20, without removing the portion of the sealing layer 30 formed on the side face of the concave portion 16.

In this way, a semiconductor device 100 in which the sealing layer 30 is provided at least on the side face of the concave portion 16, and in which the formation of the sealing layer on the wiring 20 is inhibited is manufactured.

[Other Processes]

The method of manufacturing a semiconductor device according to the first embodiment may further include any of other processes which are carried out in the manufacture of an electronic device (for example, a semiconductor device), such as a plasma treatment process in which the above described plasma treatment is carried out, a wiring formation process, and a barrier layer formation process, if necessary.

The wiring formation process can be carried out by a known method such as a metal CVD method, a sputtering method, or an electroplating method.

In a case in which the method of manufacturing a semiconductor device includes the wiring formation process, it is possible to further carry out the barrier layer (copper barrier layer) formation process, before the wiring formation process. The formation of a barrier layer serves to more effectively inhibit the diffusion of a metal component or a plasma component into the interlayer insulating layer.

The barrier layer formation process can be carried out in accordance with commonly used process conditions. A barrier layer made of a titanium compound (such as titanium nitride), a tantalum compound (such as tantalum nitride), a ruthenium compound, a manganese compound, a cobalt compound (such as CoW), a tungsten compound, or the like can be formed, for example, by a vapor phase growth method (CVD).

Further, the manufacturing method according to the first embodiment may further include a post-rinsing process in which the rinsing liquid remaining on the semiconductor device is cleaned, and which is carried out after the cleaning process. Regarding the post-rinsing process, the description in paragraph 0093 of WO 2012/033172 can be referred to, if appropriate.

The method of manufacturing a semiconductor device according to the first embodiment described above is particularly suitable for manufacturing various types of electronic devices (such as a printed wiring substrate, a semiconductor device, a substrate for a display device, and the like) as semiconductor devices.

Figure 4:
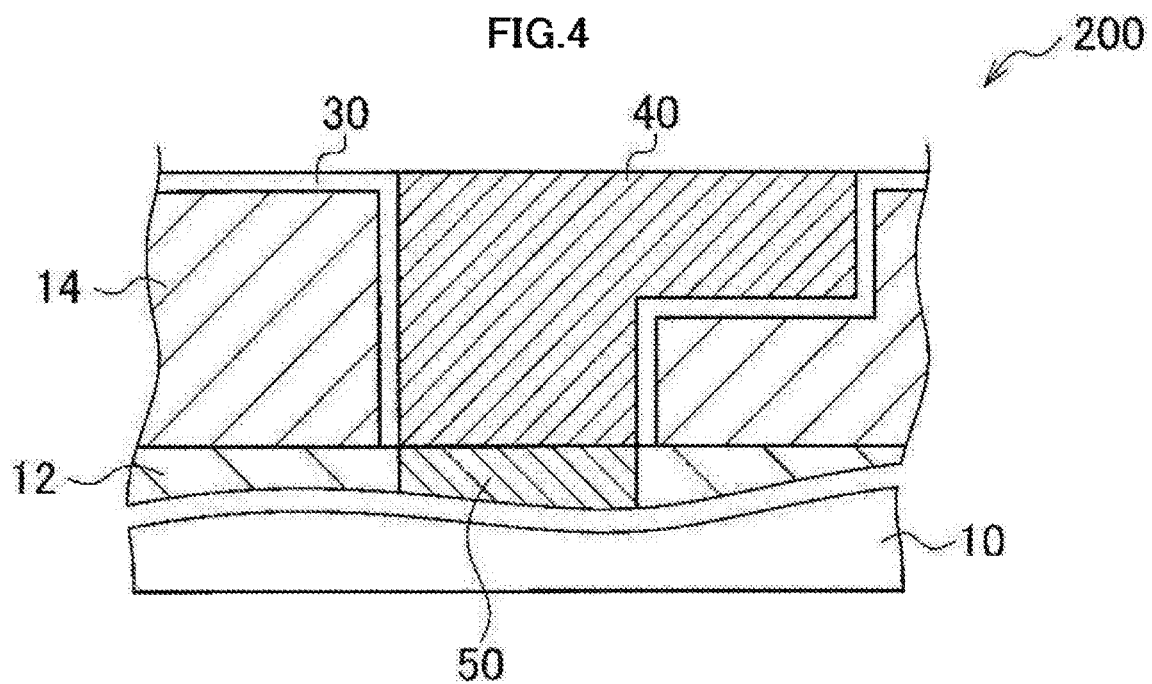
FIG. 4 is a conceptual sectional diagram schematically showing a cross section of a semiconductor device which is manufactured by the method of manufacturing a semiconductor device according to the first embodiment.

Next, an example of the semiconductor device to be manufactured by the method of manufacturing a semiconductor device according to the first embodiment will be described, with reference to FIG. 4. FIG. 4 is the conceptual sectional diagram schematically showing the cross section of a semiconductor device 200 which is manufactured by the method of manufacturing a semiconductor device according to the first embodiment.

As shown in FIG. 4, the semiconductor device 200 includes, on the semiconductor substrate 10, interlayer insulating layers including the first interlayer insulating layer 14 provided with a concave portion, and the second interlayer insulating layer 12 disposed on the lower layer side of the first interlayer insulating layer 14. The semiconductor device 200 further includes the second wiring 50 which contains copper and which is embedded in the second interlayer insulating layer 12, and the first wiring 40 which contains copper and which is embedded in the concave portion. The semiconductor device 200 further includes the sealing layer 30 which is provided at least between the side face of the concave portion formed in the first interlayer insulating layer 14 and the first wiring 40.

The first wiring 40 and the second wiring 50 are electrically connected, and the sealing layer 30 is not present at the portion at which these wirings are connected.

The semiconductor device 200 described above is a semiconductor device having a configuration in which the first wiring 40 is embedded in the concave portion 16 of the above described semiconductor device 100 (FIG. 3).

The configuration of the semiconductor substrate 10, the first interlayer insulating layer 14, the second interlayer insulating layer 12, the second wiring 50, and the sealing layer 30 in the semiconductor device 200 is the same as the configuration of the semiconductor substrate 10, the first interlayer insulating layer 14, the second interlayer insulating layer 12, the wiring 20, and the sealing layer 30 in the semiconductor device 100. Modified examples of the semiconductor device 200 are also the same as the modified examples of the semiconductor device 100.

Further, in the semiconductor device 200, the sealing layer 30 is also present at a portion (namely, on the first interlayer insulating layer 14) other than the portion between the side face of the concave portion of the first interlayer insulating layer 14 and the first wiring 40. However, the portion of the sealing layer 30 on the first interlayer insulating layer 14 may or may not be present. For example, the portion of the sealing layer 30 on the first interlayer insulating layer 14 may be removed by a planarization treatment (such as CMP) which is performed in the formation of the first wiring 40.

Second Embodiment

The method of manufacturing a semiconductor device and the sealing composition according to the second embodiment will now be described. Note that, the description regarding the items which are in common with the first embodiment will be omitted.

<Method of Manufacturing Semiconductor Device>

In the method of manufacturing a semiconductor device according to the second embodiment, the semiconductor device includes a semiconductor substrate including an interlayer insulating layer and wiring containing copper. The manufacturing method includes a sealing composition application process in which a sealing composition is applied at least to the surfaces of the interlayer insulating layer and the wiring of the semiconductor substrate; and a cleaning process in which at least the surfaces of the interlayer insulating layer and the wiring are cleaned with a rinsing liquid containing a polyvalent carboxylic acid monomer in an amount of from 0.3 millimole/liter to 230 millimole/liter, and which is carried out after the sealing composition application process. The sealing composition includes polymer (A) having a weight average molecular weight of from 2,000 to 1,000,000, and a benzotriazole compound. The content of the benzotriazole compound in the sealing composition is from 3 ppm by mass to 200 ppm by mass. The sealing composition has a pH of from 3.0 to 6.5.

According to the above described method of manufacturing a semiconductor device, it is possible to manufacture a semiconductor device in which a decrease in the amount of wiring material such as copper can be reduced, thereby maintaining the electrical conductivity of the wiring.

In other words, in the method of manufacturing a semiconductor device according to the second embodiment, the polymer (A) and the benzotriazole compound described above are combined, and the sealing composition in which each of the polymer (A) and the benzotriazole compound is adjusted to have a predetermined concentration is applied to the surfaces of the interlayer insulating layer and the wiring. In this process, it is possible to obtain an effect of making the polymer (A) contained in the sealing composition less likely to remain on the wiring, while maintaining the sealing property provided by the sealing composition at the surfaces. Further, the dissolution of a wiring material such as copper can be inhibited to reduce a decrease in the amount of the wiring material, and accordingly, the electrical conductivity of the wiring is maintained without being deteriorated. Thus, the method is particularly useful in the manufacturing of a miniaturized semiconductor device.

The content of the polymer (A) in the sealing composition used in the method of manufacturing a semiconductor device according to the second embodiment is different from the content of the polymer (A) in the sealing composition used in the first embodiment, and the content is not limited to a range of from 0.05 parts by mass to 0.20 parts by mass. For example, the content of the polymer (A) in the sealing composition used in this embodiment is preferably from 0.05 parts by mass to 0.70 parts by mass, and more preferably from 0.11 parts by mass to 0.50 parts by mass, with respect to 100 parts by mass of the sealing composition. Further, the content of the polymer (A) in the sealing composition can be adjusted based on the area and the pore density of the face on which the polymer layer is to be formed using the sealing composition. When the content of the polymer (A) in the sealing composition is 0.05 parts by mass or more, the sealing property of the sealing composition can be suitably maintained. When the content of the polymer (A) in the sealing composition is 0.70 parts by mass or less, on the other hand, it is possible to reduce the amount of the sealing composition adhered on the surface of the wiring, thereby improving the removability of the sealing composition on the surface of the wiring. In addition, in the second embodiment, a problem of polymer puddle, namely, a problem in which the polymer (A) in the sealing composition adheres to the bottom face of the concave portion, does not occur as does in the first embodiment. Therefore, the content of the polymer (A) in the sealing composition used in the second embodiment can be more than 0.20 parts by mass, which is the content of the polymer (A) in the sealing composition used in the first embodiment. When the content of the polymer (A) in the sealing composition is more than 0.20 parts by mass, the sealing property of the sealing composition can be more suitably maintained, even in a case in which the interlayer insulating layer has a larger pore radius (for example, pore radius of from 0.5 nm to 3.0 nm).

Figure 5:
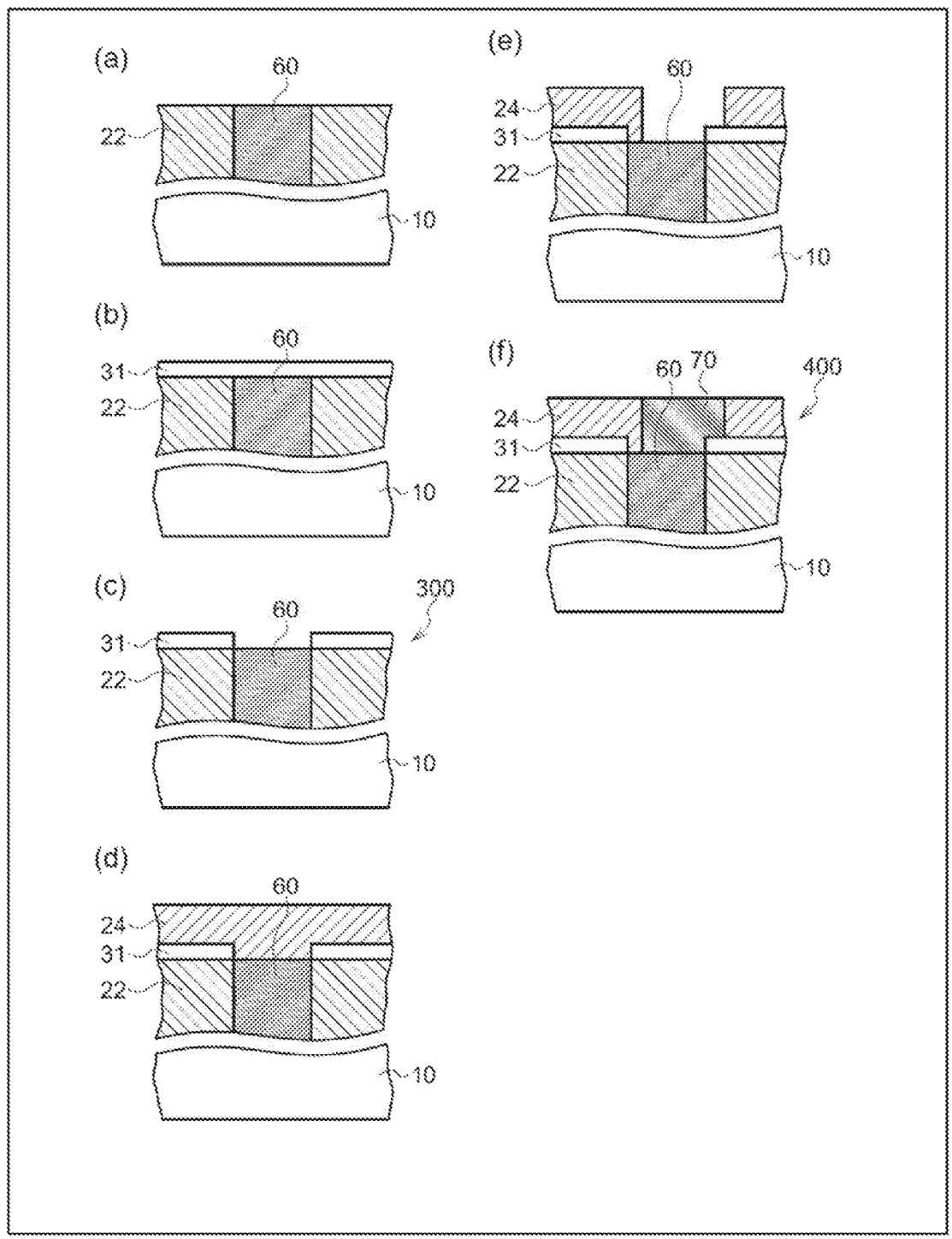
FIG. 5 is a conceptual sectional diagram schematically showing the method of manufacturing a semiconductor device according to a second embodiment of the invention.

FIG. 5 is the conceptual sectional diagram schematically showing the method of manufacturing a semiconductor device according to the second embodiment of the invention. First, a trench, a via, or the like for providing wiring is formed in an interlayer insulating layer 22 formed on a substrate 10, by an etching such as dry etching, and then a wiring material containing copper is embedded in the trench, the via, or the like. Thus, the semiconductor substrate 10 including the interlayer insulating layer 22 and wiring 60, as shown in FIG. 5 (a) can be obtained.

[Sealing Composition Application Process]

The sealing composition application process is a process in which the sealing composition is applied at least to the surface of the interlayer insulating layer 22 and the surface of the wiring 60, of the semiconductor substrate 10.

As shown in FIG. 5 (b), in the sealing composition application process, the sealing composition is applied to the semiconductor substrate 10 on the side on which the interlayer insulating layer 22 and the like are provided, and a sealing layer 31 as a semiconductor sealing layer is formed on the surface of the interlayer insulating layer 22 and the surface of the wiring 60.

[Cleaning Process]

The method of manufacturing a semiconductor device according to the second embodiment includes a cleaning process in which at least the surface of the interlayer insulating layer and the surface of the wiring are cleaned with a rinsing liquid containing a polyvalent carboxylic acid monomer in an amount of from 0.3 millimole/liter to 230 millimole/liter, and which is carried out after the sealing composition application process.

By including the cleaning process, the removability of the portion of the sealing layer formed on the surface of the wiring is further improved.

The method of manufacturing a semiconductor device according to the second embodiment may include a process other than the above mentioned sealing composition application process and the cleaning process. For example, the method may include each of the processes such as the pretreatment process, the heating process, the high temperature heating process, and other processes described above.

Figure 6:
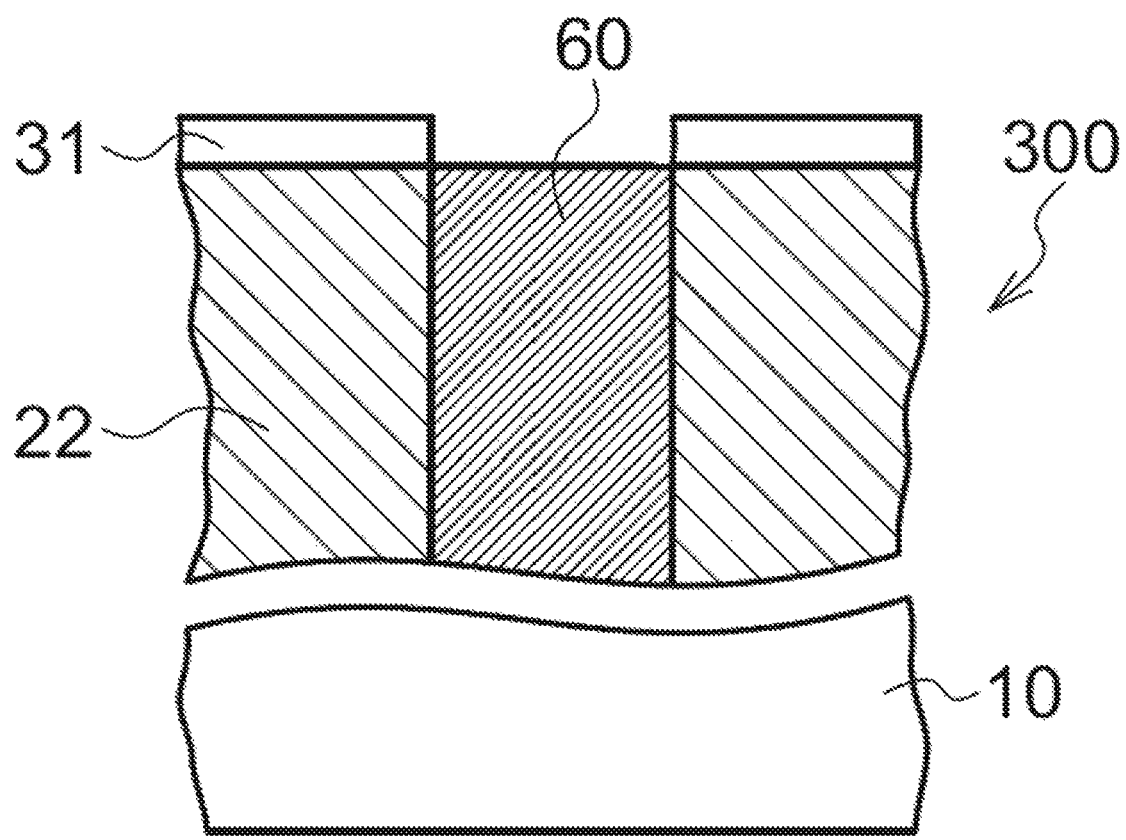
FIG. 6 is a conceptual sectional diagram schematically showing a cross section of a semiconductor device which is manufactured by the method of manufacturing a semiconductor device according to the second embodiment.

FIG. 5 (c) and FIG. 6 are the conceptual sectional diagrams each schematically showing the semiconductor substrate when the portion of the semiconductor sealing layer formed on the surface of the wiring is removed, and are also the conceptual sectional diagrams each schematically showing the cross section of the semiconductor device manufactured by the method of manufacturing a semiconductor device according to the second embodiment.

FIG. 5 (b) shows the cross section of the semiconductor substrate after being subjected to the sealing composition application process, and by cleaning the face of this semiconductor substrate on the side on which the sealing layer 31 has been formed, with the rinsing liquid in the cleaning process, the removability of the portion of the sealing layer formed on the surface of the wiring 60 is improved. Then, this portion of the sealing layer 31 can further be removed by the high temperature heat treatment. As a result, a semiconductor device 300 can be obtained.

As shown in FIG. 5 (c) and FIG. 6, the sealing layer 31 is formed on the surface of the interlayer insulating layer 22, so that the pores in the interlayer insulating layer 22 are sealed. Therefore, the surface of the interlayer insulating layer 22 is in a state protected by the sealing layer 31, in a case in which an insulating layer, a cap film, and the like are layered on the surface of the interlayer insulating layer 22, or in a case in which the surfaces of the interlayer insulating layer 22 and the wiring 60 are cleaned by plasma.

Further, a multilayer structure may be formed, if necessary, by forming a cap film on the surface of the interlayer insulating layer 22, and then forming a hard mask, followed by repeating the processes of forming an insulating layer and forming wiring. For example, as shown in FIGS. 5 (d) and 5 (e), after forming an insulating layer (an interlayer insulating layer 24) on the interlayer insulating layer 22 and the wiring 60, a trench, a via, or the like for providing wiring may be provided in the insulating layer formed on the interlayer insulating layer 22 and the wiring 60 by an etching such as dry etching, and then a wiring material containing copper may further be embedded in the trench, the via, or the like. In this way, a semiconductor device 400 as shown in FIG. 5 (f) can be obtained, which includes: the semiconductor substrate 10; the interlayer insulating layer 22 and the wiring 60 provided on the semiconductor substrate 10; and the interlayer insulating layer 24 and wiring 70 layered on the interlayer insulating layer 22 and the wiring 60.

EXAMPLES

The invention will now be specifically described with reference to Examples; however, the invention is by no means limited by the Examples.

In the description below, ultrapure water (MILLI-Q WATER, manufactured by Millipore Corporation; resistivity (at 25° C.): 18 Ω·cm or less) was used as "water".

Example 1

Polyethyleneimine 1 was synthesized as described below, and then a sealing composition containing the resulting polyethyleneimine 1 was prepared. Details are explained below.

<Synthesis of Polyethyleneimine 1>

(Synthesis of Modified Polyethyleneimine 1)

Modified polyethyleneimine 1 was synthesized according to the following Reaction Scheme 1, using polyethyleneimine as the starting material. It should be noted that the polymer structures in the following Reaction Scheme 1 and Reaction Scheme 2 are structures that are represented schematically, and the configuration of the tertiary nitrogen atom and the secondary nitrogen atom, and the proportion of the secondary nitrogen atom to be substituted by a Boc-aminoethyl group to be described later are subject to change, depending on the synthesis conditions.

~Reaction Scheme 1~

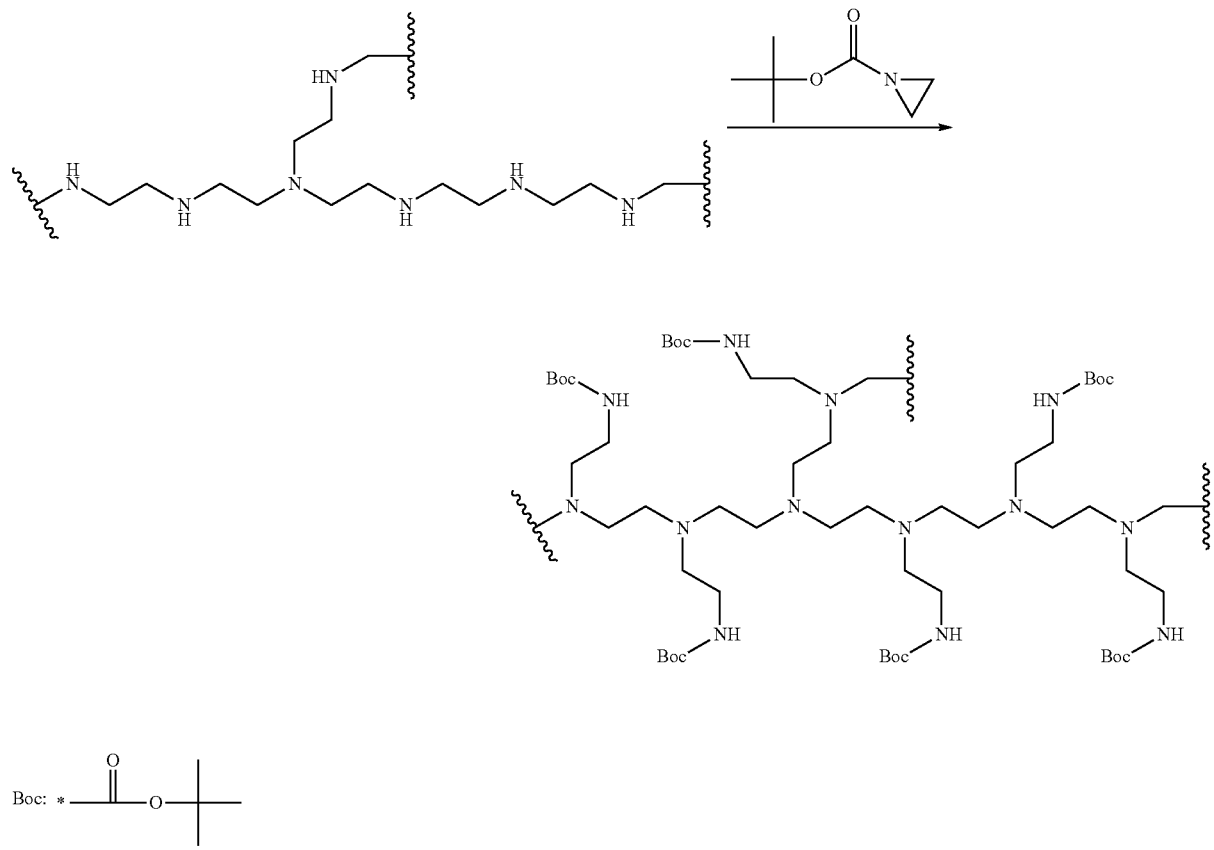

The detailed operation of Reaction Scheme 1 above is as follows.

A quantity of 61.06 g of polyethyleneimine (50% aqueous solution) manufactured by MP Biomedicals Inc. was dissolved in 319 mL of isopropanol, and then 102 g (710 mmol) of N-t-butoxycarbonyl (in Examples, the "t-butoxycarbonyl group" is also referred to as "Boc") aziridine was added thereto. The resulting mixture was heated under reflux for 3 hours, to obtain modified polyethyleneimine 1 having a structure in which a Boc-aminoethyl group is introduced into polyethyleneimine. It was confirmed, by thin layer chromatography (TLC), that N-Boc aziridine as the raw material was not present. Then a small amount was sampled, and the structure was confirmed by $^1$H-NMR. From the results of the $^1$H-NMR analysis, the introduction rate of the Boc-aminoethyl group with respect to polyethyleneimine was calculated to be 95%.

—NMR Measurement Results of Modified Polyethyleneimine 1—

$^1$H-NMR (CD$_3$OD); δ 3.3-3.0 (br. s, 2), 2.8-2.5 (Br. s, 6.2), 1.45 (s, 9)

(Synthesis of Polyethyleneimine 1)

Polyethyleneimine 1 was synthesized according to the following Reaction Scheme 2, using the modified polyethyleneimine 1 as the starting material.

~Reaction Scheme 2~

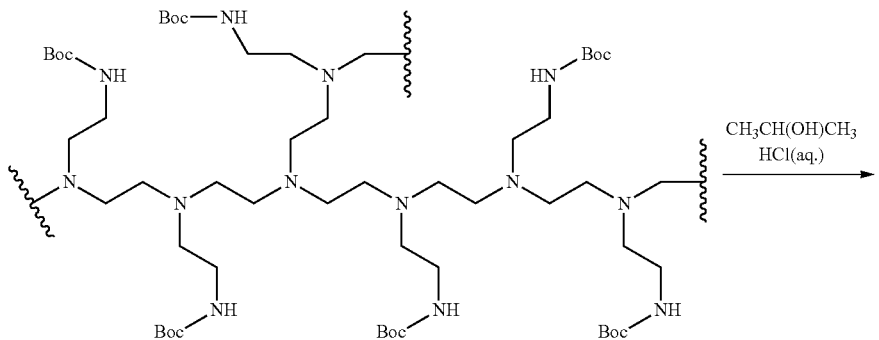

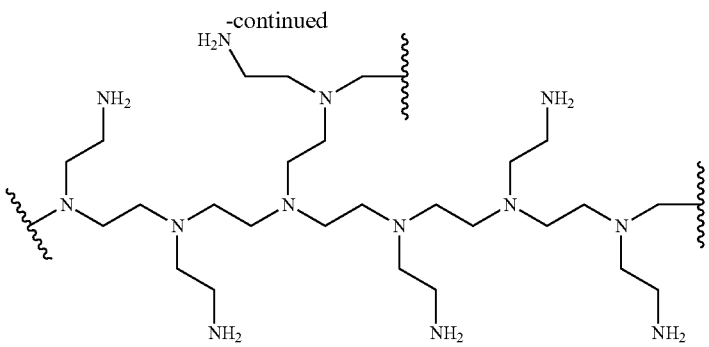

The detailed operation of Reaction Scheme 2 above is as follows.

A quantity of 124 mL of 12N hydrochloric acid was slowly added to an isopropanol solution of modified polyethyleneimine 1. The solution thus obtained was stirred under heating at 50° C. for 4 hours, with careful attention to the generation of gas. Along with the generation of gas, a gum-like reaction product was generated in the reaction system. The reaction system was cooled after the completion of the generation of gas. After cooling, the solvent that had been separated from this gum-like reaction product was removed, and then the resulting reaction product was washed three times with 184 mL of methanol. The reaction product that had been washed was dissolved in water, and chlorine ions were removed by using an anion exchange polymer, to obtain an aqueous solution containing 58 g of polyethyleneimine 1.

—NMR Measurement Results of Polyethyleneimine 1—

$^1$H-NMR ($D_2O$); δ 2.8-2.4 (br. m)

$^{13}$C-NMR ($D_2O$); δ (integration ratio) 57.2 (1.0), 54.1 (0.38), 52.2 (2.26), 51.6 (0.27), 48.5 (0.07), 46.7 (0.37), 40.8 (0.19), 38.8 (1.06).

The weight average molecular weight, the molecular weight distribution, the cationic functional group (primary nitrogen atom, secondary nitrogen atom, tertiary nitrogen atom, and quaternary nitrogen atom) equivalent weight, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) of the above obtained polyethyleneimine 1 were measured.

As a result, the weight average molecular weight was 40,575, the molecular weight distribution was 17.47, the cationic functional group equivalent weight was 43, the amount of primary nitrogen atom was 46% by mole, the amount of secondary nitrogen atom was 11% by mole, the amount of tertiary nitrogen atom was 43% by mole, the amount of quaternary nitrogen atom was 0% by mole, and the branching degree was 80%.

The "cationic functional group equivalent weight" as used herein is a value of the molecular weight with respect to one cationic functional group, and can be calculated based on the polymer structure.

Further, the amount (% by mole) of primary nitrogen atom, the amount (% by mole) of secondary nitrogen atom, the amount (% by mole) of tertiary nitrogen atom, the amount (% by mole) of quaternary nitrogen atom, and the branching degree (%) were determined as follows. Namely, the polymer sample (polyethyleneimine 1) was dissolved in heavy water, and $^{13}$C-NMR measurement of the resulting solution was performed at 80° C., using an AVANCE 500 type nuclear magnetic resonance apparatus, manufactured by Bruker Corporation, in accordance with the single pulse inverse gated decoupling method. Based on the measurement results, an analysis was performed to determine which class of amine (nitrogen atom) each of the carbon atoms is bound to, and the above amounts and the branching degree were calculated based on the integrated value thereof. The assignment is described in European Polymer Journal, vol. 9, page 559, 1973, and the like.

The weight average molecular weight and the molecular weight distribution were measured using an analyzer, SHODEX GPC-101, and using a column, ASAHIPAK GF-7M HQ, and calculated using polyethylene glycol as the reference standard. Further, as the eluent, an aqueous solution having an acetic acid concentration of 0.5 mol/L and a sodium nitrate concentration of 0.1 mol/L was used. However, as is known in the Mark-Houwink-Sakurada equation, the calibration curve of GPC changes as the branching degree increases, and thus, the obtained weight average molecular weight and molecular weight distribution should only be considered as numerical values in terms of polyethylene glycol.

Here, the amount (% by mole) of primary nitrogen atom, the amount (% by mole) of secondary nitrogen atom, the amount (% by mole) of tertiary nitrogen atom, and the amount (% by mole) of quaternary nitrogen atom are amounts represented by the following Equations A to D, respectively. The branching degree was determined according to the following Equation E.

Amount (% by mole) of primary nitrogen atom=(molar number of primary nitrogen atom/(molar number of primary nitrogen atom+molar number of secondary nitrogen atom+molar number of tertiary nitrogen atom+molar number of quaternary nitrogen atom))×100    Equation A Amount (% by mole) of secondary nitrogen atom=(molar number of secondary nitrogen atom/(molar number of primary nitrogen atom+molar number of secondary nitrogen atom+molar number of tertiary nitrogen atom+molar number of quaternary nitrogen atom))×100    Equation B Amount (% by mole) of tertiary nitrogen atom=(molar number of tertiary nitrogen atom/(molar number of primary nitrogen atom+molar number of secondary nitrogen atom+molar number of tertiary nitrogen atom+molar number of quaternary nitrogen atom))×100    Equation C Amount (% by mole) of quaternary nitrogen atom=(molar number of quaternary nitrogen atom/(molar number of primary nitrogen atom+molar number of secondary nitrogen atom+molar number of tertiary nitrogen atom+molar number of quaternary nitrogen atom))×100    Equation D Branching degree (%)=((amount (% by mole) of tertiary nitrogen atom+amount (% by mole) of quaternary nitrogen atom)/(amount (% by mole) of secondary nitrogen atom+amount (% by mole) of tertiary nitrogen atom+amount (% by mole) of quaternary nitrogen atom))×100    Equation E <Preparation of Sealing Compositions>

Example 1

To the aqueous solution of polyethyleneimine 1 (weight average molecular weight: 40,575, cationic functional group equivalent weight: 43) obtained as described above, water, acetic acid and benzotriazole (1,2,3-benzotriazole) were added, followed by mixing, to obtain sealing composition 1A.

In the preparation of sealing composition 1A, the amounts of water, acetic acid and benzotriazole added were selected such that the concentration of polyethyleneimine 1 in the sealing composition was 0.18% by mass, and the pH of the sealing composition was 4.3, and the concentration of benzotriazole was 10 ppm by mass. The pH as used herein refers to a value obtained by measuring the pH of the sealing composition at 25° C. (the same applies hereinafter). The pH of the sealing composition was obtained as follows. A pH meter (KRSE) manufactured by AS ONE Corporation was calibrated with a pH standard solution, and then the pH meter was immersed in the solution to be measured. The value of the pH was read when the value had stabilized.

Examples 2 to 10

The same procedure as in the preparation of sealing composition 1A was repeated, except that the contents and the pHs were changed to the contents and the pHs shown in Table 1, to obtain sealing compositions 2A to 10A (referred to as Examples 2 to 10, respectively).

Comparative Examples 1 to 15

The same procedure as in the preparation of sealing composition 1A was repeated, except that the contents and the pHs were changed to the contents and the pHs shown in Table 1, to obtain sealing compositions 4B to 18B (referred to as Comparative Examples 1 to 15, respectively), which were used for comparison. Sealing compositions 4B and 5B are examples of compositions which do not contain benzotriazole. Sealing compositions 7B to 16B are examples of compositions which do not contain benzotriazole, but which contain oxalic acid, 8-quinolinol, propargylamine, 2,2'-bipyridine, or phenanthroline, which is generally used as a corrosion inhibitor. Sealing composition 17B is an example of a composition which contains more than 200 ppm by mass of benzotriazole. Further, sealing composition 6B is an example of a composition which contains less than 10 ppm by mass of benzotriazole; and sealing composition 18B is an example of a composition which contains less than 10 ppm by mass of benzotriazole, and which has a pH of more than 6.5.

The content of sodium and the content of potassium in each of the resulting sealing compositions were measured using an inductively coupled plasma mass spectrometer (ICP-MS). As a result, the contents were all equal to or less than the detection limit (less than 1 ppb by mass).

<Measurement of Amount of Copper Ion Dissolution>

Next, the amount of copper dissolution into the sealing composition was measured by applying the sealing composition on a copper film.

First, a silicon substrate on which a copper film having a thickness of 100 nm had been formed by plating was prepared, and the surface of the copper film was cleaned by helium plasma treatment, followed by washing with pure water. The resultant was immersed in 20 cc of the above prepared sealing composition 1A for 3 minutes, and then retrieved from the composition. The copper ion content in the sealing composition 1A after the immersion was measured using an inductively coupled plasma mass spectrometer (ICP-MS), and the obtained value was defined as the amount of copper ion dissolution.

The measurement of the amount of copper ion dissolution was also performed for sealing compositions 2A to 10A, and 4B to 18B, in the same manner.

The compositions, and the measurement results of the amounts of copper dissolution, of the respective sealing compositions are shown in Table 1.

TABLE 1

| | | Sealing Composition | | | Amount |
|---|---|---|---|---|---|
| | No. | Components | pH | Benzotriazole Concentration (ppm) | of Copper Dissolution (ppb) |
| Example 1 | 1A | polyethyleneimine (0.18 wt %)/ benzotriazole (10 ppm)/acetic acid | 4.3 | 10 | 71 |
| Example 2 | 2A | polyethyleneimine (0.11 wt %)/ benzotriazole (6.1 ppm)/acetic acid | 4.3 | 6.1 | 77 |
| Example 3 | 3A | polyethyleneimine (0.14 wt %)/ benzotriazole (5.6 ppm)/acetic acid | 4.3 | 5.6 | 86 |
| Example 4 | 4A | polyethyleneimine (0.18 wt %)/ benzotriazole (20 ppm)/acetic acid | 4.3 | 20 | 64 |
| Example 5 | 5A | polyethyleneimine (0.4 wt %)/ benzotriazole (22.22 ppm)/acetic acid | 4.3 | 22.22 | 57 |
| Example 6 | 6A | polyethyleneimine (0.18 wt %)/ benzotriazole (30 ppm)/acetic acid | 4.3 | 30 | 44 |
| Example 7 | 7A | polyethyleneimine (0.18 wt %)/ benzotriazole (40 ppm)/acetic acid | 4.3 | 40 | 40 |
| Example 8 | 8A | polyethyleneimine (0.18 wt %)/ benzotriazole (50 ppm)/acetic acid | 4.3 | 50 | 39 |
| Example 9 | 9A | polyethyleneimine (0.18 wt %)/ benzotriazole (100 ppm)/acetic acid | 4.3 | 100 | 33 |
| Example 10 | 10A | polyethyleneimine (0.18 wt %)/ benzotriazole (200 ppm)/acetic acid | 4.3 | 200 | 21 |
| Comparative Example 1 | 4B | polyethyleneimine (0.25 wt %)/ formic acid | 3.8 | 0 | 520 |

TABLE 1-continued

| | No. | Sealing Composition Components | pH | Benzotriazole Concentration (ppm) | Amount of Copper Dissolution (ppb) |
|---|---|---|---|---|---|
| Comparative Example 2 | 5B | polyethyleneimine (0.25 wt %)/ acetic acid | 4.3 | 0 | 520 |
| Comparative Example 3 | 6B | polyethyleneimine (0.25 wt %)/ benzotriazole (1.0 ppm)/acetic acid | 4.3 | 1 | 520 |
| Comparative Example 4 | 7B | polyethyleneimine (0.18 wt %)/ oxalic acid (10 ppm)/acetic acid | 4.3 | 0 | 400 |
| Comparative Example 5 | 8B | polyethyleneimine (0.18 wt %)/ 8-quinolinol (10 ppm)/acetic acid | 4.3 | 0 | 360 |
| Comparative Example 6 | 9B | polyethyleneimine (0.18 wt %)/ propargylamine (10 ppm)/acetic acid | 4.3 | 0 | 430 |
| Comparative Example 7 | 10B | polyethyleneimine (0.18 wt %)/ 2,2'-bipyridine (10 ppm)/acetic acid | 4.3 | 0 | 400 |
| Comparative Example 8 | 11B | polyethyleneimine (0.18 wt %)/ phenanthroline (10 ppm)/acetic acid | 4.3 | 0 | 420 |
| Comparative Example 9 | 12B | polyethyleneimine (0.18 wt %)/ oxalic acid (50 ppm)/acetic acid | 4.3 | 0 | 390 |
| Comparative Example 10 | 13B | polyethyleneimine (0.18 wt %)/ 8-quinolinol (50 ppm)/acetic acid | 4.3 | 0 | 430 |
| Comparative Example 11 | 14B | polyethyleneimine (0.18 wt %)/ 2,2'-bipyridine (50 ppm)/acetic acid | 4.3 | 0 | 460 |
| Comparative Example 12 | 15B | polyethyleneimine (0.18 wt %)/ phenanthroline (50 ppm)/acetic acid | 4.3 | 0 | 510 |
| Comparative Example 13 | 16B | polyethyleneimine (0.18 wt %)/ propargylamine (50 ppm)/acetic acid | 4.3 | 0 | 520 |
| Comparative Example 14 | 17B | polyethyleneimine (0.18 wt %)/ benzotriazole (300 ppm)/acetic acid | 4.3 | 300 | 17 |
| Comparative Example 15 | 18B | polyethyleneimine (0.18 wt %)/ benzotriazole (10 ppm) | 10 | 10 | 87 |

It can be seen from Table 1 that the higher the concentration of benzotriazole is, the lower the amount of copper dissolution is.

Further, it has been found out that the amount of copper dissolution is increased, in a case in which benzotriazole was not contained, or in a case in which benzotriazole was contained only in a small amount.

These results revealed that the amount of copper dissolution can be reduced when the concentration of benzotriazole in the sealing composition is 3 ppm or more. When the amount of copper dissolution is 150 ppb or less, the amount of copper dissolution is considered to be low, and thus it is preferred.

Comparative Example 16

The same procedure as in the preparation of sealing composition 2A was carried out, except that content and the pH were changed to the content and the pH shown in Table 2, to obtain sealing composition 19B (as an example of the composition which does not contain benzotriazole), which was used for comparison.

<Evaluation of Thickness of Polymer Layer on Silicon (Si)>

(Preparation of Samples for Measuring Thickness)

Silicon wafers on the surface of which silica is present were prepared. Each of the silicon wafers was placed on a spin coater, and 1.0 mL of each of the sealing compositions (Example 2, and Comparative Examples 1 and 4) shown in Table 2 was dropped on each wafer at a constant speed for 10 seconds, and maintained for 13 seconds. Each silicon wafer was then rotated at 2,000 rpm for 1 second, then at 600 rpm for 30 seconds, and then at 2,000 rpm for 10 seconds, to carry out drying.

In this way, a sealing layer (polymer layer) was formed on each of the silicon wafers, thereby obtaining layered bodies (hereinafter also referred to as "samples (Si/PEIs)"), each having a structure in which the silicon wafer and the polymer layer are disposed one on another in layers.

Each of the thus obtained samples (Si/PEIs) was placed on a hot plate such that the silicon wafer side of the sample was in contact with the hot plate, and subjected to soft bake (heat treatment) at a soft bake temperature of 100° C. for 60 seconds, under an air atmosphere.

The soft bake temperature as used herein refers to a temperature of the surface of the silicon wafer (the temperature of the face of the silicon wafer on which a polymer layer is to be formed, before the formation of the polymer layer).

(Evaluation of Thickness of Polymer Layer)

The thickness (nm) of the polymer layer formed on the surface of the silicon wafer where silica is present was measured by an ordinary method, using an ellipsometer of an optical porosimeter (PS-1200) manufactured by SEMI-LAB CO., LTD.

The results are shown in Table 2.

<Evaluation of Thickness of Polymer Layer on Copper Exposed at Bottom Face of Via of Patterned Wafer>

(Preparation of Samples for Measuring Thickness)

Silicon wafers were prepared in each of which a copper film having a thickness of 100 nm had been formed on the wafer by plating, and a SiO$_2$ film having a thickness of 100 nm had been further formed on the copper film by a CVD method. Then a via through-hole having a width of 110 nm was formed in the SiO$_2$ film of each of the wafers until the copper film was exposed, to obtain patterned wafers.

Each of the thus obtained patterned wafers was placed on a spin coater, and 1.0 mL of each of the sealing compositions shown in Table 2 was dropped on the face of each wafer on which the pattern had formed, at a constant speed for 10 seconds, and maintained for 13 seconds. Each silicon wafer was then rotated at 2,000 rpm for 1 second, then at 600 rpm for 30 seconds, and then at 2,000 rpm for 10 seconds, to carry out drying.

In this way, a sealing layer (polymer layer) was formed on each of the patterned wafers, thereby obtaining layered bodies (hereinafter, also referred to as "samples (VIA/PEIs)"), each having a structure in which the patterned wafer and the polymer layer are disposed one on another in layers.

Each of the thus obtained samples (VIA/PEIs) was placed on a hot plate such that the silicon wafer side of the sample was in contact with the hot plate, and subjected to soft bake (heat treatment) at a soft bake temperature of 100° C. for 60 seconds, under an air atmosphere.

(Evaluation of Thickness of Polymer Layer)

The thickness of the portion of the polymer layer on copper which is exposed at the bottom face of each of the patterned wafers was measured as follows.

After subjecting the samples to soft bake, Pt (platinum) sputtering was performed on the surface of each of the samples on the side on which the polymer layer had been formed, followed by carbon deposition to form a protective layer. Then a FIB processing apparatus, SMI-2050 (manufactured by Seiko Instruments Inc.) was used to perform thin slicing (thin slicing in the direction in which the cross section of the copper wiring can be observed) of the samples, thereby obtaining specimens to be observed.

Each of the specimens to be observed was observed using a field emission transmission electron microscope (FE-TEM) (JEM-2200FS, manufactured by JEOL Ltd.), and the thickness of the portion of the polymer layer on the copper wiring which is exposed at the bottom face of the via was measured. As the measured value, the thickness of the polymer layer (also referred to as a "puddle amount") measured at the central portion of the via was used.

The results are shown in Table 2.

In this way, a sealing layer (polymer layer) was formed on each of the silicon wafers, thereby obtaining layered bodies (hereinafter also referred to as "samples (Si/PEIs)"), each having a structure in which the silicon wafer and the polymer layer are disposed one on another in layers.

Each of the thus obtained samples (Si/PEIs) was placed on a hot plate such that the silicon wafer side of the sample was in contact with the hot plate, and subjected to soft bake (heat treatment) at a soft bake temperature of 100° C. for 60 seconds, under an air atmosphere.

The soft bake temperature as used herein refers to a temperature of the surface of the silicon wafer (the temperature of the face of the silicon wafer on which a polymer layer is to be formed, before the formation of the polymer layer).

(Cleaning Treatment)

The polymer layer of each of the thus obtained samples (Si/PEIs) was cleaned with an aqueous solution of 4,4'-oxydiphthalic acid (0.62 millimole/liter)/ethylamine (pH: 5.2, liquid temperature: 22° C.) as the rinsing liquid, by dropping the aqueous solution on the polymer layer at a dropping speed of 0.1 mL/sec for 30 seconds, while rotating each sample on a spin coater at 600 rpm. Each of the samples was then rotated at 2,000 rpm for 60 seconds to carry out drying, and then ultrapure water (liquid temperature: 22° C.) was dropped on the polymer layer at a dropping speed of 0.1 mL/sec for 30 seconds, followed by rotating the sample at 2,000 rpm for 60 seconds to carry out drying.

(Evaluation of Thickness of Polymer Layer after Cleaning Treatment)

Next, the thickness of the polymer layer (PEI) of each of the samples which had been subjected to the cleaning treatment as described above was measured. The thickness of the polymer layer (nm) was measured by an ordinary method, using an ellipsometer of an optical porosimeter (PS-1200) manufactured by SEMILAB CO., LTD.

TABLE 2

| | NO | Sealing Composition Components | pH | Polyethyleneimine Concentration (wt %) | Thickness of Polymer Layer (nm) | Puddle Amount (nm) |
|---|---|---|---|---|---|---|
| Example 2 | 2A | polyethyleneimine (0.11 wt %)/ benzotriazole (6.1 ppm)/acetic acid | 4.3 | 0.11 | 3.3 | 5 |
| Comparative Example 1 | 4B | polyethyleneimine (0.25 wt %)/ formic acid | 3.8 | 0.25 | 9.4 | 40 |
| Comparative Example 16 | 19B | polyethyleneimine (0.5 wt %)/ formic acid | 3.8 | 0.5 | 21.8 | 80 |

In Example 2, the puddle amount was 5 nm, and the thickness of the polymer layer on copper is found to be sufficiently reduced. In each of Comparative Examples 1 and 16, a high puddle amount was observed. When the puddle amount is 35 nm or less, the puddle amount was determined to be low.

<Evaluation of Thickness of Polymer Layer on Silicon (Si)>

(Preparation of Samples for Measuring Thickness)

Silicon wafers on the surface of which silica is present were prepared. Each of the silicon wafers was placed on a spin coater, and 1.0 mL of each of the sealing compositions shown in Table 3 was dropped on each wafer at a constant speed for 10 seconds, and maintained for 23 seconds. Each silicon wafer was then rotated at 2,000 rpm for 1 second, then at 600 rpm for 30 seconds, and then at 2,000 rpm for 10 seconds, to carry out drying.

The results are shown in Table 3.

<Evaluation of the Thickness of Polymer Layer on Copper (Cu)>

(Preparation of Samples for Measuring Thickness)

Silicon substrates were prepared in each of which a copper film having a thickness of 100 nm had been formed on the substrate by plating, and the surface of the copper film had been cleaned by helium plasma treatment. The silicon substrates were then subjected to the same treatments as described in the section of <Evaluation of Polymer Layer on Silicon (Si)>, in order to form a sealing layer (polymer layer) on each copper film surface which had been plasma treated.

In this way, a polymer layer was formed on the copper film of each of the substrates, thereby obtaining layered bodies (hereinafter also referred to as "samples (Cu/PEIs)")

each having a structure in which the copper film and the polymer layer are disposed one on another in layers.

(Cleaning Treatment)

The polymer layer of each of the thus obtained samples (Cu/PEIs) was cleaned with an aqueous solution of 4,4'-oxydiphthalic acid (0.62 millimole/liter)/ethylamine (pH: 5.2, liquid temperature: 22° C.) as the rinsing liquid, by dropping the aqueous solution on the polymer layer at a dropping speed of 0.1 mL/sec for 30 seconds, while rotating each sample on a spin coater at 600 rpm. Each of the samples was then rotated at 2,000 rpm for 60 seconds to carry out drying, and then ultrapure water (liquid temperature: 22° C.) was dropped on the polymer layer at a dropping speed of 0.1 mL/sec for 30 seconds, followed by rotating the sample at 2,000 rpm for 60 seconds to carry out drying.

(Evaluation of Thickness of Polymer Layer after Cleaning Treatment)

Next, the thickness of the polymer layer (PEI) of each of the samples which had been subjected to the cleaning treatment as described above was measured. The thickness of the polymer layer (nm) on copper (Cu) was measured by the following method, using an ellipsometer of an optical porosimeter (PS-1200) manufactured by SEMILAB CO., LTD.

Namely, the thickness of the polymer layer on an optically flat copper substrate was calculated by regressing the polarization parameter measured according to ellipsometry in a multilayer optical model: (air)/(polymer layer)/(copper substrate), using WINELLI II. The range of the light energy used is from 2.2 eV to 5.0 eV. As a refractive index of the polymer layer, the same value as the refractive index of silica ($SiO_2$) was used at all times. Further, as the refractive index and extinction coefficient of the copper substrate, values obtained by measuring the polarization parameter of a copper substrate which does not include thereon a polymer layer, and then analyzing the results using analysis software, WINELLI II.

The results are shown in Table 3.

TABLE 3

| | | pH | Film Thickness on Wafer (nm) | Film Thickness on Copper (nm) |
|---|---|---|---|---|
| Example 1 | polyethyleneimine (0.18 wt %)/ benzotriazole (10 ppm)/ acetic acid | 4.3 | 7.8 | 0 |
| Example 4 | polyethyleneimine (0.18 wt %)/ benzotriazole (20 ppm)/ acetic acid | 4.3 | 7.8 | 0.3 |
| Example 5 | polyethyleneimine (0.4 wt %)/ benzotriazole (22.22 ppm)/ acetic acid | 4.3 | 22.9 | 0.2 |
| Example 6 | polyethyleneimine (0.18 wt %)/ benzotriazole (30 ppm)/ acetic acid | 4.3 | 7.5 | 0.5 |
| Example 7 | polyethyleneimine (0.18 wt %)/ benzotriazole (40 ppm)/ acetic acid | 4.3 | 7.5 | 1.1 |
| Example 8 | polyethyleneimine (0.18 wt %)/ benzotriazole (50 ppm)/ acetic acid | 4.3 | 7.7 | 1.1 |
| Example 9 | polyethyleneimine (0.18 wt %)/ benzotriazole (100 ppm)/ acetic acid | 4.3 | 6.9 | 1.2 |
| Comparative Example 14 | polyethyleneimine (0.18 wt %)/ benzotriazole (300 ppm)/ acetic acid | 4.3 | — | 1.6 |

TABLE 3-continued

| | | pH | Film Thickness on Wafer (nm) | Film Thickness on Copper (nm) |
|---|---|---|---|---|
| Comparative Example 15 | polyethyleneimine (0.18 wt %)/ benzotriazole (10 ppm) | 10 | 9.3 | 10.9 |
| Comparative Example 4 | polyethyleneimine (0.18 wt %)/ oxalic acid (10 ppm)/ acetic acid | 4.3 | 8 | 2.5 |

As shown in Table 3, in each of the samples of the Examples, the thickness of the polymer layer on copper (Film Thickness on Copper) was 1.5 nm or less; namely, the thickness of the polymer layer on copper was sufficiently reduced. In the sample of Comparative Example 14, the thickness of the polymer layer on copper was slightly greater than the thickness of the respective samples of the Examples. In addition, when the polymer layer was formed on the silicon wafer, the polymer layer was formed unevenly, making it unable to measure the film thickness on wafer. Further, in the samples of Comparative Examples 4 and 15 (particularly, in the sample of Comparative Example 15), the thickness of the polymer layer on copper was greater than the thickness of the respective samples of the Examples.

<Preparation of Silicon Wafers with Interlayer Insulating Layer (Low-k Film)>

(Preparation of Precursor Solution)

A quantity of 77.4 g of bistriethoxysilylethane and 70.9 g of ethanol were mixed while stirring at room temperature. Then, 80 mL of 1 mol/L nitric acid was added to the resultant, followed by stirring at 50° C. for 1 hour. Next, a solution obtained by dissolving 20.9 g of polyoxyethylene (20) stearyl ether with 280 g of ethanol was dropped into the resultant and mixed. After the mixing, the resultant was stirred at 30° C. for 4 hours. The resulting solution was concentrated at 25° C. under a reduced pressure of 30 hPa, until the amount of the solution reached 105 g. After the concentration, a solution obtained by mixing 1-propyl alcohol and 2-butyl alcohol at a ratio of 2:1 by volume was added to the resultant, to obtain 1,800 g of a precursor solution.

(Preparation of Composition for Forming Porous Silica)

To 472 g of the precursor solution, 3.4 g of dimethyldiethoxysilane and 1.8 g of hexamethyldisiloxane were added, and the resultant was stirred at 25° C. for 1 hour, to obtain a composition for forming a porous silica. At this time, the added amounts of dimethyldiethoxysilane and hexamethyldisiloxane with respect to the amount of bistriethoxysilylethane were 10% by mole and 5% by mole, respectively.

(Formation of Interlayer Insulating Layer)

A quantity of 1.0 mL of the composition for forming a porous silica was dropped on the surface of silicon wafers, followed by rotation at 2,000 rpm for 60 seconds to coat the composition on the surface of the silicon wafers. The silicon wafers were then subjected to a heat treatment at 150° C. under a nitrogen atmosphere for 1 minute, and then at 350° C. for 10 minutes. Subsequently, the resulting wafers were placed in a chamber equipped with an excimer lamp having a wave length of 172 nm, and subjected to a heat treatment at a temperature of up to 350° C., and subjected to UV light irradiation at an output of 14 mW/cm$^2$ and at a pressure of 1 Pa for 10 minutes, to form an interlayer insulating layer (a porous silica film) on each of the silicon wafers.

In this way, silicon wafers with an interlayer insulating layer (hereinafter, also referred to as a "low-k film" or "low-k") were obtained.

The pore radius of the resulting interlayer insulating layer was 1.6 nm.

Further, the dielectric constant k of the resulting interlayer insulating layer was 2.5.

In addition, the elastic modulus of the resulting interlayer insulating layer was 8.8 GPa.

The pore radius was calculated from a desorption isotherm of toluene. The measurement of the desorption isotherm of toluene was carried out using an optical porosimeter (PS-1200) manufactured by SEMILAB CO., LTD., in the same manner as described for the evaluation of the sealing property to be described later. The calculation of the pore radius was carried out in accordance with the method described in Journal of Vacuum Science and Technology B (2000) 18, 1385-1391, by M. R. Baklanov, K. P. Mogilnikov, V. G. Polovinkin, and F. N. Dultsey, and using the Kelvin equation.

The dielectric constant was measured by an ordinary method, using a mercury probe apparatus (SSM5130) at 25° C. under an atmosphere of a relative humidity of 30%, at a frequency of 1 MHz.

Further, the elastic modulus was measured by an ordinary method, using a nanoindenter (TRIBOSCOPE, manufactured by Hysitron, Inc.) at an indentation depth of equal to or less than 1/10 of the film thickness.

Comparative Example 17

The same procedure as in the preparation of sealing composition 1A was carried out, except that the content and the pH were changed to the content and the pH shown in Table 4, to obtain sealing composition 20B (as an example of the composition which does not contain benzotriazole), which was used for comparison.

<Preparation of Samples for Measuring Thickness of Polymer Layer on Low-k Film>

On the surface of the low-k film of each of the silicon wafers with a low-k film obtained as described above, a polymer layer was formed using each of the sealing compositions shown in Table 4, thereby obtaining layered bodies (hereinafter, also referred to as "samples (Si/low-k/PEIs)") each having a structure in which the silicon wafer with a low-k film and the polymer layer are disposed one on another in layers.

The formation of the polymer layer was carried according to the following method. Each of the silicon wafers with a low-k film obtained as described above was placed on a spin coater, and 1.0 mL of each of the sealing compositions (sealing composition 1A and sealing composition 20B) shown in Table 4 was dropped on the surface of the low-k film of each wafer at a constant speed for 10 seconds, and maintained for 13 seconds. Each silicon wafer was then rotated at 2,000 rpm for 1 second, then at 600 rpm for 30 seconds, and then at 2,000 rpm for 10 seconds, to carry out drying.

Each of the thus obtained samples (Si/low-k/PEIs) was placed on a hot plate such that the silicon wafer side of the sample was in contact with the hot plate, and subjected to a soft bake (heat treatment) at a soft bake temperature of 100° C. for 60 seconds, under an air atmosphere.

The "soft bake temperature" as used herein is a temperature of the surface of the silicon wafer.

(Cleaning Treatment 1)

The sample (Si/low-k/PEI) which had been prepared as a layered body using sealing composition 1A and then subjected to the soft bake, was placed on a spin coater, and the polymer layer thereof was cleaned with an aqueous solution of 4,4'-oxydiphthalic acid (0.62 millimole/liter)/ethylamine (pH: 5.2, liquid temperature: 22° C.) as the rinsing liquid, by dropping the aqueous solution on the polymer layer at a dropping speed of 0.1 mL/sec for 30 seconds, while rotating the sample on a spin coater at 600 rpm. The sample was then rotated at 2,000 rpm for 60 seconds to carry out drying, and then ultrapure water (liquid temperature: 22° C.) was dropped on the polymer layer at a dropping speed of 0.1 mL/sec for 30 seconds, followed by rotating the sample at 2,000 rpm for 60 seconds to carry out drying.

(Cleaning Treatment 2)

The sample (Si/low-k/PEI) which had been prepared as a layered body using sealing composition 20B and then subjected to the soft bake, was placed on a spin coater, and the polymer layer thereof was cleaned with pyromellitic acid (pH: 3.4) as the rinsing liquid, by dropping pyromellitic acid on the polymer layer at a dropping speed of 0.1 mL/sec for 30 seconds, while rotating the sample on a spin coater at 600 rpm. The sample was then rotated at 2,000 rpm for 60 seconds to carry out drying, and then ultrapure water (liquid temperature: 22° C.) was dropped on the polymer layer at a dropping speed of 0.1 mL/sec for 30 seconds, followed by rotating the sample at 2,000 rpm for 60 seconds to carry out drying.

(Heat Treatment)

Next, the samples (Example 1 and Comparative Example 5) which had been subjected to the cleaning treatments 1 and 2, respectively, were each subjected to a heat treatment (hard bake treatment) under the following conditions. First, each sample (Si/low-k/PEI) was placed in an oven (SPX-1120, manufactured by APEX Co.) and a heat treatment was carried out at 350° C. for 2 minutes on the side of the sample on which the sealing layer (PEI) had been formed, under the conditions of a nitrogen gas ($N_2$) atmosphere, and a pressure of 10,000 Pa. The above described temperature is a temperature of the surface of the sample (Si/low-k/PEI) on the side on which the sealing layer (PEI) has been formed.

In this way, samples for evaluating the sealing property before the plasma treatment were obtained.

<Evaluation of Thickness of Sealing Layer after Heat Treatment>

Next, the thickness of the sealing layer (PEI) of each of the thus obtained samples for evaluating the sealing property after the heat treatment (samples for evaluating the sealing property before the plasma treatment) was measured. The thickness of the sealing layer (nm) was measured by an ordinary method, using an ellipsometer of an optical porosimeter (PS-1200) manufactured by SEMILAB CO., LTD.

The results are shown in Table 4.

<Preparation of Samples for Evaluating Sealing Property after Plasma Treatment>

The sealing layer (PEI) side of each of the samples for evaluating the sealing property after the heat treatment was further subjected to a plasma treatment under the following conditions, thereby preparing samples for evaluating the sealing property after the plasma treatment.

—Conditions for Plasma Treatment—

| | |
|---|---|
| Gas to be used | Hydrogen gas |
| Electrodes to be used | Parallel plate electrodes (diameter: 10 cm) |

-continued

| | |
|---|---|
| Ultimate vacuum | Less than $2 \times 10^{-5}$ Torr |
| Hydrogen gas flow | 5 minutes |
| Discharge power | 100 W |
| Discharge frequency | 13.56 MHz |
| Pressure during the discharge | 150 mTorr |
| Electrode temperature | Room temperature |
| Sample surface temperature | Room temperature |
| Hydrogen gas flow rate | 50 sccm |
| Sample mounting side | On an anode electrode to which the ground potential (0 V) was applied |
| Treatment time (discharge time) | 20 seconds |

<Evaluation of Sealing Property after Plasma Treatment>

The evaluation of the sealing property of the samples for evaluating the sealing property after the plasma treatment was carried out as follows.

The sealing property was evaluated by carrying out a toluene adsorption measurement for each of the samples (Si/low-k/PEIs), at the surface of the sealing layer (PEI). In the toluene adsorption measurement, a lower amount of toluene adsorbed indicates a higher sealing property of the sealing layer to prevent the penetration of a wiring material (such as copper) into the low-k film.

The toluene adsorption measurement was carried out using an optical porosimeter (PS-1200) manufactured by manufactured by SEMILAB CO., LTD.

The measurement was carried out in accordance with the method described in Journal of Vacuum Science and Technology B (2000) 18, 1385-1391, by M. R. Baklanov, K. P. Mogilnikov, V. G. Polovinkin, and F. N. Dultsey.

The adsorption-desorption isotherms of toluene gas are the isotherms which indicate the relationship between the toluene relative pressure ($P/P_0$; wherein P represents a partial pressure of toluene at room temperature, and $P_0$ represents the saturated vapor pressure of toluene at room temperature), and a volume fraction of the amount of toluene adsorbed (the ratio of the volume of toluene adsorbed at room temperature with respect to the total volume of the low-k film; the unit is "%"). The volume fraction of the amount of toluene adsorbed was obtained based on the refractive index of the low-k film, using the Lorentz-Lorenz equation.

Based on the thus obtained adsorption-desorption isotherms of toluene gas, the volume fraction (%) of the amount of toluene adsorbed when the toluene relative pressure ($P/P_0$) was 1.0, and the sealing property was evaluated based on the thus obtained value. In the evaluation, a lower value of the volume fraction (%) of the amount of toluene adsorbed indicates a higher sealing property.

The evaluation results are shown in Table 4.

<Evaluation of Thickness of Sealing Layer after Plasma Treatment>

Next, the measurement of the thickness of the sealing layer (PEI) was performed for each of the samples for evaluating the sealing property after the plasma treatment, obtained as described above. The thickness of the sealing layer (nm) was measured by an ordinary method, using an ellipsometer of an optical porosimeter (PS-1200) manufactured by SEMILAB CO., LTD.

The results are shown in Table 4.

TABLE 4

| | | Sealing Composition | | Rinsing Liquid | | Thickness of Sealing Layer after Hard Bake (nm) | Thickness of Sealing Layer after Plasma Treatment (nm) | Volume Fraction of Amount of Toluene Absorbed after Plasma Treatment (%) |
|---|---|---|---|---|---|---|---|---|
| | NO | Components | pH | Components | pH | | | |
| Example 1 | 1A | polyethyleneimine (0.18 wt)/ benzotriazole (10 ppm)/ acetic acid | 4.3 | 4,4'-oxydiphthalic acid/ethylamine | 5.2 | 5.1 | 3.5 | 5.4 |
| Comparative Example 17 | 20B | polyethyleneimine (0.18 wt)/ acetic acid | 9.5 | Pyromellitic acid | 3.4 | 2.7 | 1.6 | 26.5 |

Specifically, a sample chamber in which samples (Si/low-k/PEIs) were placed was evacuated to 5 mTorr at a temperature range of from 23 to 26° C., and then toluene gas was introduced to the sample chamber, sufficiently slowly. At each pressure, in situ measurement of the refractive index of the low-k film of each of the samples was carried out, using an ellipsometer apparatus. This operation was repeated until the pressure inside the sample chamber reached a saturated vapor pressure of toluene. In the same manner, the measurement of the refractive index at each pressure was carried out, while gradually evacuating the atmosphere inside the sample chamber. By carrying out the above operation, the change in the refractive index due to the toluene adsorption to and desorption from the low-k film was obtained. Further, using the Lorentz-Lorenz equation, the adsorption-desorption isotherms of toluene gas were obtained from the relative pressure characteristics of the refractive index.

It has been found out that, in Example 1 in which the sample was prepared using sealing composition 1A and cleaned with an aqueous solution of 4,4'-oxydiphthalic acid (0.62 millimole/liter)/ethylamine (pH: 5.2, liquid temperature: 22° C.) as the rinsing liquid, the volume fraction of the amount of toluene adsorbed after the plasma treatment is sufficiently low, and thus, the sample has a high sealing property. On the other hand, in Comparative Example 17 in which the sample was prepared using sealing composition 20B, which has the same polyethyleneimine concentration as the concentration thereof in the sealing composition 1A used in Example 1, and cleaned with pyromellitic acid (pH 3.4) as the rinsing liquid, the volume fraction of the amount of toluene adsorbed after the plasma treatment is high, revealing that the sample does not have sufficient sealing property.

The disclosure of Japanese Patent Application No. 2014-162433 filed on Aug. 8, 2014 is incorporated herein by reference in their entirety.

All publications, patent applications, and technical standards mentioned in the present specification are incorporated herein by reference to the same extent as if such individual publication, patent application, or technical standard was specifically and individually indicated to be incorporated by reference.

DESCRIPTION OF SYMBOLS

10 Semiconductor substrate
12 Second interlayer insulating layer
14 First interlayer insulating layer
16 Concave portion
20 Wiring
20a Exposed face
22 Interlayer insulating layer
24 Interlayer insulating layer
30, 31 Sealing layer
40 First wiring
50 Second wiring
60, 70 Wiring
100, 200, 300, 400 Semiconductor device

The invention claimed is:

1. A sealing composition, comprising:
polymer (A) containing a cationic functional group and having a weight average molecular weight of from 2,000 to 1,000,000;
a benzotriazole compound; and
a monocarboxylic acid;
wherein a content of the polymer (A) is from 0.05 parts by mass to 0.20 parts by mass with respect to 100 parts by mass of the sealing composition;
wherein a content of the benzotriazole compound in the sealing composition is from 3 ppm by mass to 200 ppm by mass; and
wherein the sealing composition has a pH of from 3.0 to 6.5.

2. The sealing composition according to claim 1, wherein a content of sodium and a content of potassium in the sealing composition are each 10 ppb by mass or less, on an elemental basis.

3. A method of manufacturing a semiconductor device, the semiconductor device comprising a semiconductor substrate including an interlayer insulating layer provided with a concave portion, and wiring containing copper, wherein at least a part of a surface of the wiring is exposed to at least a part of a bottom face of the concave portion, the method comprising:
applying the sealing composition according to claim 1 at least to the bottom face and a side face of the concave portion of the semiconductor substrate; and
after the applying of the sealing composition, cleaning at least the side face and the bottom face of the concave portion with a rinsing liquid containing a polyvalent carboxylic acid monomer in an amount of from 0.3 millimole/liter to 230 millimole/liter.

4. The method of manufacturing a semiconductor device according to claim 3, wherein the polyvalent carboxylic acid monomer satisfies at least one of the following: having two aromatic rings; or having a molecular weight of 342 or more.

5. The method of manufacturing a semiconductor device according to claim 3, wherein the rinsing liquid has a pH of from 4.0 to 7.0.

6. The method of manufacturing a semiconductor device according to claim 3, wherein a content of sodium and a content of potassium in the sealing composition are each 10 ppb by mass or less on an elemental basis.

7. The method of manufacturing a semiconductor device according to claim 3, the method further comprising, after the applying of the sealing composition and before the cleaning, heating the semiconductor substrate at a temperature of from 70° C. to 125° C.

8. The method of manufacturing a semiconductor device according to claim 3, the method further comprising, after the cleaning, high temperature heating of the semiconductor substrate at a temperature of from 200° C. to 425° C.

9. The method of manufacturing a semiconductor device according to claim 3, wherein the sealing composition further comprises a monocarboxylic acid.

10. A sealing composition, comprising:
polymer (A) containing a cationic functional group and having a weight average molecular weight of from 2,000 to 1,000,000;
a benzotriazole compound; and
a monocarboxylic acid;
wherein a content of the benzotriazole compound in the sealing composition is from 3 ppm by mass to 200 ppm by mass; and
wherein the sealing composition has a pH of from 3.0 to 6.5.

11. The sealing composition according to claim 10, wherein a content of sodium and a content of potassium in the sealing composition are each 10 ppb by mass or less, on an elemental basis.

12. A method of manufacturing a semiconductor device, the semiconductor device comprising a semiconductor substrate including an interlayer insulating layer, and wiring containing copper, the method comprising:
applying the sealing composition according to claim 10 at least to surfaces of the interlayer insulating layer and the wiring of the semiconductor substrate; and
after the applying of the sealing composition, cleaning at least the surfaces of the interlayer insulating layer and the wiring with a rinsing liquid containing a polyvalent carboxylic acid monomer in an amount of from 0.3 millimole/liter to 230 millimole/liter.

13. The method of manufacturing a semiconductor device according to claim 12, wherein the polyvalent carboxylic acid monomer satisfies at least one of the following: having two aromatic rings; or having a molecular weight of 342 or more.

14. The method of manufacturing a semiconductor device according to claim 12, wherein the rinsing liquid has a pH of from 4.0 to 7.0.

15. The method of manufacturing a semiconductor device according to claim 12, wherein a content of sodium and a content of potassium in the sealing composition are each 10 ppb by mass or less on an elemental basis.

16. The method of manufacturing a semiconductor device according to claim 12, the method further comprising, after the applying of the sealing composition and before the cleaning, heating the semiconductor substrate at a temperature of from 70° C. to 125° C.

17. The method of manufacturing a semiconductor device according to claim 12, the method further comprising, after the cleaning, high temperature heating of the semiconductor substrate at a temperature of from 200° C. to 425° C.

18. The method of manufacturing a semiconductor device according to claim 12, wherein the sealing composition further comprises a monocarboxylic acid.

* * * * *